US012740133B2

(12) United States Patent
Chuang et al.

(10) Patent No.: US 12,740,133 B2
(45) Date of Patent: Sep. 15, 2026

(54) VOLUMELESS THRESHOLD VOLTAGE TUNING FOR STACKED DEVICE STRUCTURES

(71) Applicant: Taiwan Semiconductor Manufacturing Company, Ltd., Hsin-Chu (TW)

(72) Inventors: Yao-Teng Chuang, Hsinchu (TW); Te-Yang Lai, Hsinchu (TW); Kuei-Lun Lin, Keelung City (TW); Tsung-Da Lin, Hsinchu (TW); Chi On Chui, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 358 days.

(21) Appl. No.: 18/403,056

(22) Filed: Jan. 3, 2024

(65) Prior Publication Data

US 2024/0290662 A1 Aug. 29, 2024

Related U.S. Application Data

(60) Provisional application No. 63/486,561, filed on Feb. 23, 2023.

(51) Int. Cl.
*H10D 84/03* (2025.01)
*H10D 30/43* (2025.01)
(Continued)

(52) U.S. Cl.
CPC ........... *H10D 84/038* (2025.01); *H10D 30/43* (2025.01); *H10D 30/6735* (2025.01); (Continued)

(58) Field of Classification Search
CPC .. H10D 84/038; H10D 30/43; H10D 30/6735; H10D 30/6757; H10D 62/121
See application file for complete search history.

(56) References Cited

U.S. PATENT DOCUMENTS 5,870,484 A * 2/1999 Greenberger ........... H04S 3/002 381/300
11,450,664 B2 * 9/2022 Huang ................ H10D 64/017
(Continued)

FOREIGN PATENT DOCUMENTS

CN 113823597 A * 12/2021 ......... H10D 64/0134
CN 115528093 A * 12/2022 .............. H10P 32/20
(Continued)

*Primary Examiner* — Laura M Menz
(74) *Attorney, Agent, or Firm* — HAYNES AND BOONE, LLP

(57) ABSTRACT

Dipole engineering techniques for stacked device structures are disclosed herein. According to various aspects of the present disclosure, an exemplary dipole engineering technique includes (1) forming at least two patterned dipole dopant source layers having different patterns and covering gate dielectric layers of some transistors, but not other transistors, (2) performing a thermal drive-in process (e.g., a dipole drive-in anneal), and (3) after removing the dipole dopant source layer, forming gate electrodes for the transistors, where a same gate electrode material is used for the transistors. Thickness(es) and/or material characteristics (e.g., dipole dopant) of the patterned dipole dopant source layers and/or parameters of the thermal drive-in process may be configured to achieve desired threshold voltages. Such technique may provide $2^N$ threshold voltages (Vt), where N is a number of patterned dipole dopant source layers formed on the gate dielectric layers of the transistors to tune their threshold voltages.

20 Claims, 16 Drawing Sheets

(51) Int. Cl.

*H10D 30/67* (2025.01)
*H10D 62/10* (2025.01)
*H10D 84/01* (2025.01)
*H10D 84/85* (2025.01)
*H10P 32/20* (2026.01)

(52) U.S. Cl.

CPC ....... *H10D 30/6757* (2025.01); *H10D 62/121* (2025.01); *H10D 84/0181* (2025.01); *H10D 84/85* (2025.01); *H10P 32/20* (2026.01)

(56) References Cited

U.S. PATENT DOCUMENTS 11,600,533 B2* 3/2023 Hsu ........................ H10D 84/85
11,894,460 B2* 2/2024 Hsu ...................... H10D 30/701
11,961,840 B2* 4/2024 Huang ................. H10D 64/017
11,996,334 B2* 5/2024 Hsu .................... H10D 84/0181
12,009,400 B2* 6/2024 Chan .................... H10D 62/121
12,040,365 B1* 7/2024 Lai ......................... H10D 64/01
12,100,595 B2* 9/2024 Yang .................. H10D 64/0134
12,317,574 B2* 5/2025 Chan .................. H10D 30/6757
12,389,675 B2* 8/2025 Huang ................. H10D 64/017
12,396,248 B2* 8/2025 Hsu ...................... H10D 30/014
2019/0148237 A1* 5/2019 Wang ................. H10D 84/0144 257/288
2021/0210388 A1* 7/2021 Zhang ................ H10D 30/6757
2022/0093472 A1* 3/2022 Hsu .................... H10D 30/6735
2022/0165731 A1* 5/2022 Huang ................. H10D 64/017
2022/0254640 A1* 8/2022 Yang .................. H10D 64/0134
2022/0262928 A1* 8/2022 Chan .................. H10D 30/6735
2022/0320342 A1* 10/2022 Hsu ...................... H10D 30/701
2022/0367291 A1* 11/2022 Hsu .................... H10D 64/0134
2022/0384434 A1* 12/2022 Huang ................. H10D 64/017
2023/0067715 A1* 3/2023 Yuh ........................ H10B 61/22
2023/0129769 A1* 4/2023 Hsu ...................... H10D 84/038 257/288
2023/0178601 A1* 6/2023 Lai ..................... H10D 30/6757 257/288
2023/0317790 A1* 10/2023 Chuang .............. H10D 30/6735 257/288
2023/0360926 A1* 11/2023 Chu ................... H10D 30/6757
2024/0150192 A1* 5/2024 Chang ................... C01F 17/235
2024/0243060 A1* 7/2024 Huang ................ H10W 20/063
2024/0249943 A1* 7/2024 Lin .................... H10D 30/6735
2024/0250086 A1* 7/2024 Lin ...................... H10D 30/024
2024/0274604 A1* 8/2024 Huang ................. H10D 64/017
2024/0290630 A1* 8/2024 Lai ......................... H10D 64/01
2024/0290662 A1* 8/2024 Chuang .............. H10D 30/6757
2024/0312845 A1* 9/2024 Hsu ...................... H10D 62/121
2024/0322040 A1* 9/2024 Lai ..................... H10D 84/0177
2024/0332382 A1* 10/2024 Chan .................... H10D 64/514
2024/0347606 A1* 10/2024 Lai ......................... H10D 64/01
2025/0259847 A1* 8/2025 Xu ................... H10D 64/01332
2025/0287677 A1* 9/2025 Chan .................... H10D 62/121
2025/0324753 A1* 10/2025 Huang ................. H10D 64/017
2025/0331279 A1* 10/2025 Song .................... H10D 64/669
2025/0331286 A1* 10/2025 Hsu ........................ H10D 84/85
2025/0357124 A1* 11/2025 Lin .................... H10D 30/6735
2025/0366157 A1* 11/2025 Chuang .............. H10D 30/6757
2025/0366185 A1* 11/2025 Lin ...................... H10D 30/024
2025/0380505 A1* 12/2025 Choi .................. H10D 84/0177
2026/0047179 A1* 2/2026 Gandikota ......... H10D 84/0144
2026/0107551 A1* 4/2026 Su ........................ H10D 64/665

FOREIGN PATENT DOCUMENTS

CN 118039484 A * 5/2024 ......... H10D 30/6215
CN 118039564 A * 5/2024
CN 118213327 A * 6/2024 ......... H10D 84/0135
CN 118352313 A * 7/2024 ......... H10D 84/0167
CN 118352357 A * 7/2024 ........... H10D 64/512
CN 120076363 A * 5/2025 .............. H10P 32/20
CN 121531779 A * 2/2026 ......... H10D 84/0181
DE 102024100063 A1 * 7/2024 .............. H10P 32/19
DE 102024100842 A1 * 7/2024 ........... H10D 30/014
KR 20240029324 A * 3/2024 ........... H10D 64/685
KR 20240117054 A * 7/2024 .............. H10P 32/19
KR 20240117061 A * 7/2024 ........... H10D 30/014
TW 202201644 A 1/2022
TW 202218118 A 5/2022
TW 202303683 A 1/2023

* cited by examiner 215
214
210
212A
212B
212C
212D
20L-1
20L-2
20L-3
20L-4
Vt1
Vt2
Vt3
Vt4

222
220

230
232

272
215"
215A
215B
215C
215D

VOLUMELESS THRESHOLD VOLTAGE TUNING FOR STACKED DEVICE STRUCTURES

This is a non-provisional application of and claims benefit of U.S. Provisional Patent Application Ser. No. 63/486,561, filed Feb. 23, 2023, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

One area of advancement is directed to providing ICs with transistors having multiple threshold voltages (Vt), which can boost performance of some transistors of an IC while reducing power consumption of other transistors of the IC. However, providing multiple threshold voltages has been challenging for multigate devices, such as fin-like field effect transistors, gate-all-around transistors including nanowires and/or nanosheets, and other types of multigate devices, because multigate devices are becoming very small, which leaves minimal room for tuning their threshold voltages using different work function metals. Though dipole engineering can provide multigate devices with multiple threshold voltages while minimizing and/or eliminating the need for using different work function metals, dipole engineering techniques present challenges as device stacking is implemented to realize further scaling. Accordingly, although existing threshold voltage tuning techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
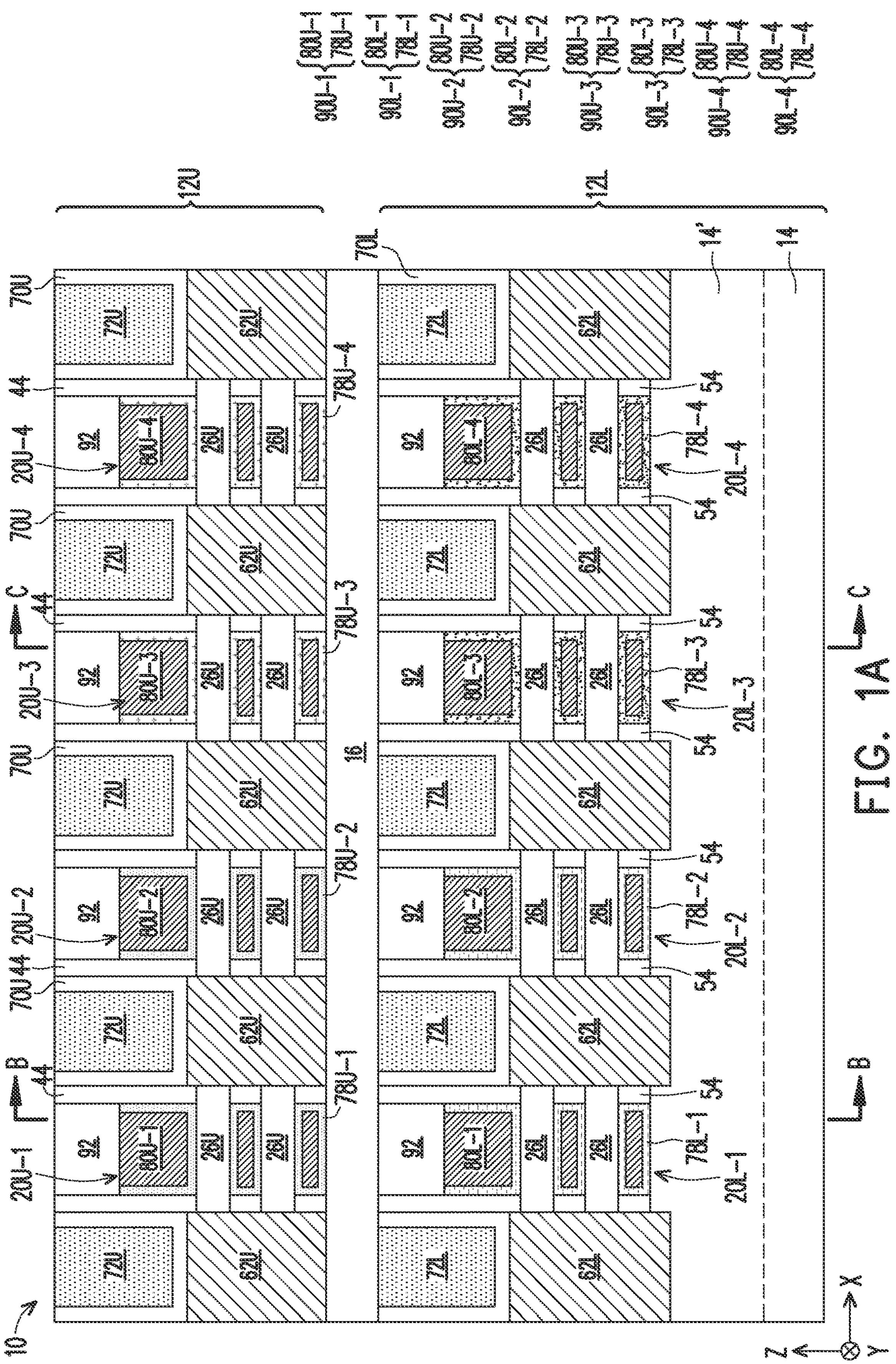
FIG. 1A is a cross-sectional view of a stacked device structure according to various aspects of the present disclosure.

The present disclosure relates generally to stacked device structures, such as transistor stacks having n-type transistors and p-type transistors (i.e., complementary field effect transistors (CFETs)), and more particularly, to methods for tuning threshold voltages (including dipole engineering techniques) of transistors of stacked device structures.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. The present disclosure may also repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Furthermore, given the variances inherent in any manufacturing process, when device features are described as having "substantial" properties and/or characteristics, such term is intended to capture properties and/or characteristics that are within tolerances of manufacturing processes. For example, "substantially vertical" or "substantially horizontal" features are intended to capture features that are approximately vertical and horizontal within given tolerances of the manufacturing processes used to fabricate such features—but not mathematically or perfectly vertical and horizontal.

Stacked transistor structures provide further density reduction for advanced integrated circuit (IC) technology nodes, especially when the stacked transistor structures include multigate devices, such as fin-like field effect transistors (FinFETs), gate-all-around (GAA) transistors including nanowires and/or nanosheets, other types of multigate devices, etc. Stacked transistor structures vertically stack transistors. For example, a transistor stack may include a first transistor (e.g., a top transistor) disposed over a second transistor (e.g., a bottom transistor). The transistor stack provides a CFET when the first transistor and the second transistor are of opposite conductivity type (i.e., an n-type transistor and a p-type transistor).

An IC may include numerous transistor stacks. Providing the IC with transistors having multiple threshold voltages (Vt) can maximize its performance and/or reliability, for example, by boosting speed/performance of some transistors of the IC while reducing power consumption of other transistors of the IC. However, providing multigate devices with multiple threshold voltages is challenging because multigate devices are becoming very small, which leaves minimal room for tuning their threshold voltages using different work function metals. Dipole engineering may flexibly provide multigate devices with different threshold voltages by incorporating dipole dopants into gate dielectrics thereof and minimize and/or eliminate the need for using different work function metals. This may obviate the need of patterning work function metals, making dipole engineering very suitable for nano-sized transistors, such as FinFETs and GAA transistors. Although existing dipole engineering techniques have been generally adequate for their intended purposes, they have not been entirely satisfactory in all respects.

The present disclosure provides dipole engineering techniques that can realize additional multi-threshold voltage tuning. According to various aspects of the present disclosure, an exemplary dipole engineering technique includes (1) forming a patterned dipole dopant source layer that covers gate dielectric layers of some bottom (or top) transistors, but not other bottom (or top) transistors, (2) preforming a thermal drive-in process (e.g., a dipole drive-in anneal), and (3) after removing the dipole dopant source layer, forming gate electrodes for the bottom (or top) transistors, where a same gate electrode material is used for the bottom (or top) transistors. Thickness(es) and/or material characteristics (e.g., dipole dopant) of the patterned dipole dopant source layer and parameters of the thermal drive-in process may be configured to achieve desired threshold voltages of the bottom (or top) transistors. Such technique can provide $2^N$ Vt, where N is a number of patterned dipole dopant source layers formed to tune the threshold voltages of the bottom (or top) transistors. For example, bottom (or top) transistors may be tuned to have two different threshold voltages ($2^1=2$) by implementing one patterned dipole dopant source layer (i.e., N=1), four different threshold voltages ($2^2=4$) by implementing two patterned dipole dopant source layers (i.e., N=2), eight different threshold voltages ($2^3=8$) by implementing three patterned dipole dopant source layers (i.e., N=3), etc. Since the patterned dipole dopant source layer is removed and threshold voltage modification is achieved without implementing different work function metals and/or different work function material layer thicknesses, the disclosed dipole engineering technique provides volumeless threshold voltage tuning. In other words, threshold voltages are modified without adding another layer to final gate stacks of the bottom (or top) transistors. Different embodiments may have different advantages, and no particular advantage is required of any embodiment.

Figure 1B:
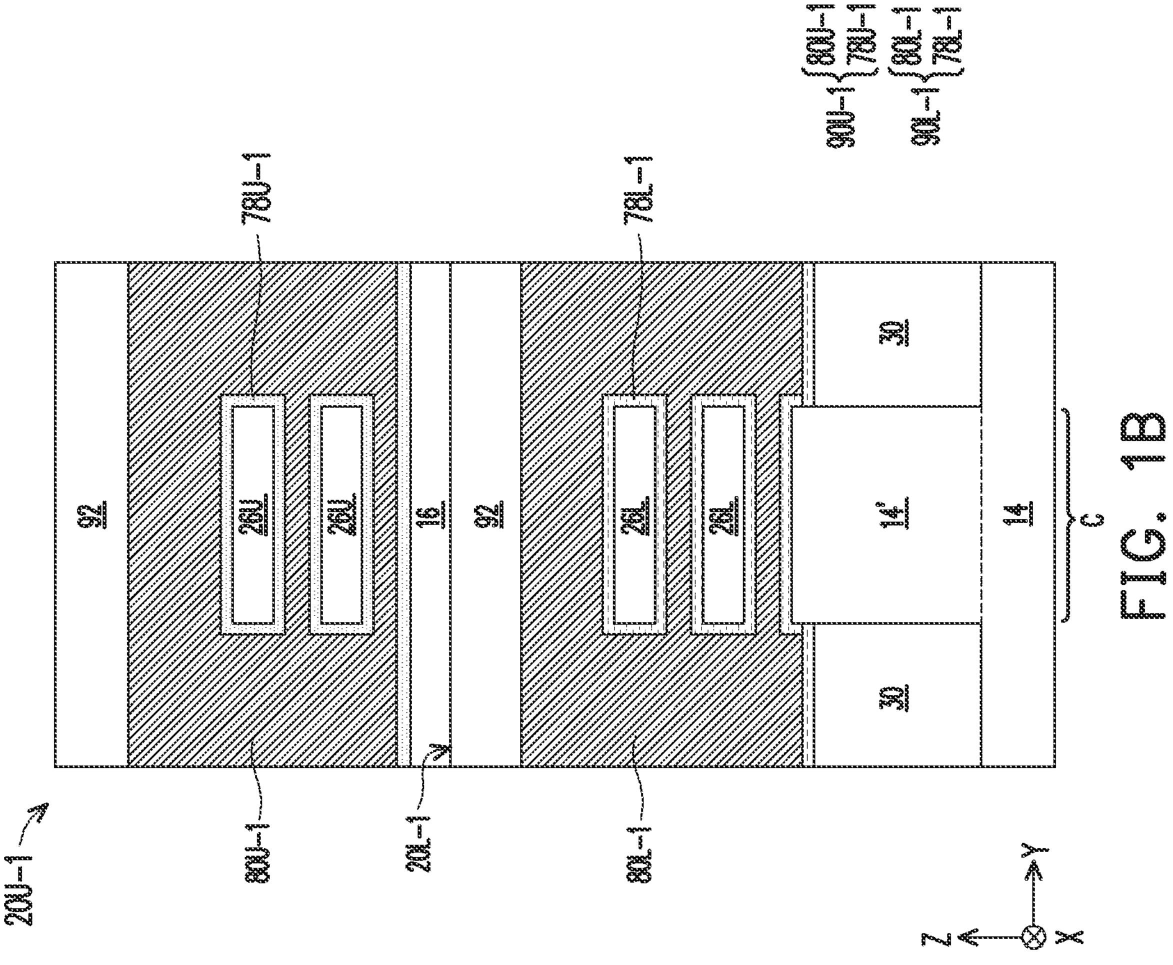
FIG. 1B and FIG. 1C are cross-sectional views of the stacked device structure of FIG. 1A, in portion or entirety, according to various aspects of the present disclosure.
Figure 1C:
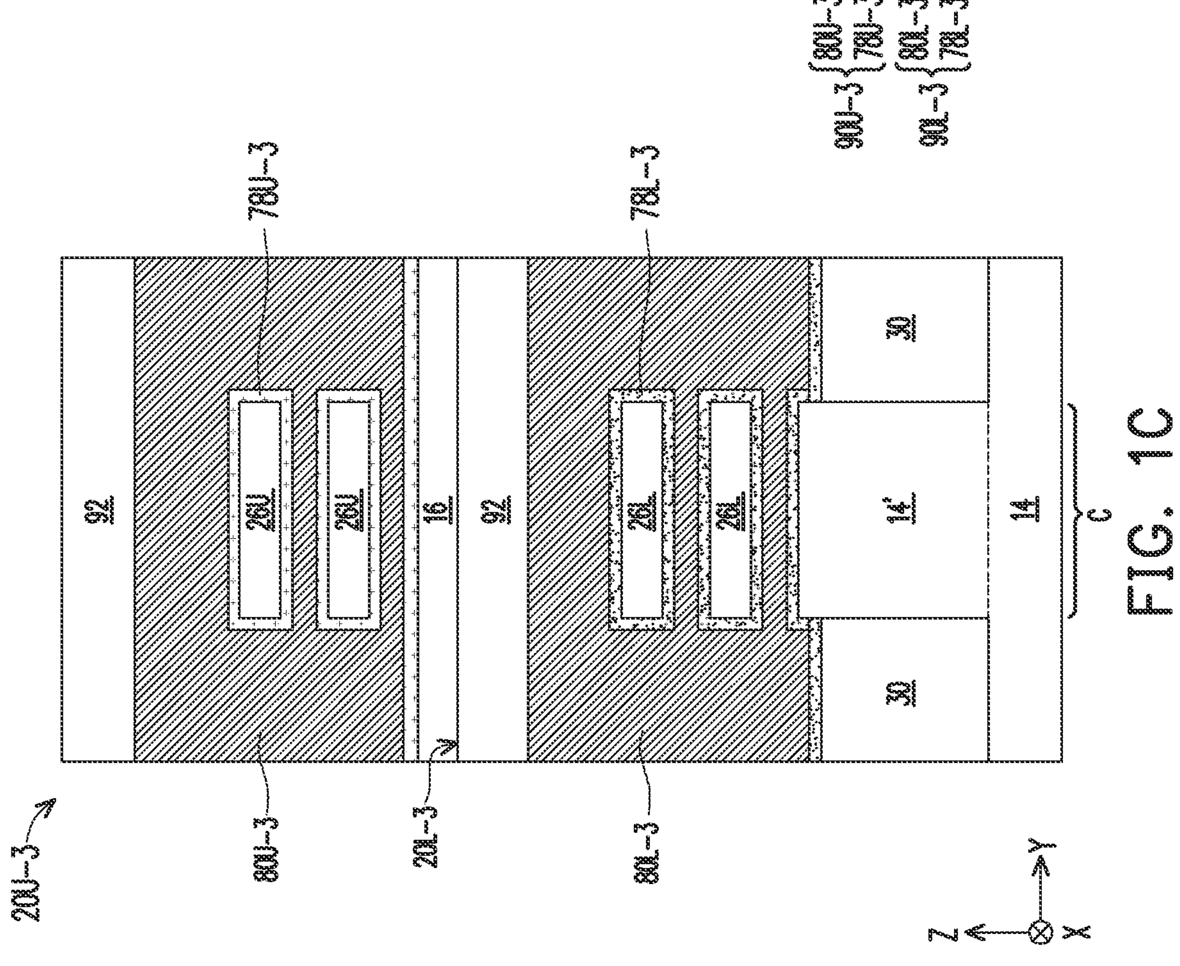

FIG. 1A is a cross-sectional view of a stacked device structure 10, in portion or entirety, according to various aspects of the present disclosure. FIG. 1B and FIG. 1C are cross-sectional views of stacked device structure 10, in portion or entirety, along line B-B and line C-C, respectively, of FIG. 1A according to various aspects of the present disclosure. Stacked device structure 10 may be fabricated sequentially, and thus may be referred to as a sequential stacked device structure. Stacked device structure 10 includes a device stack (e.g., an upper device 12U vertically stacked over a lower device 12L) disposed over a substrate 14. An isolation structure 16 may be between and separate upper device 12U and lower device 12L. In some embodiments, device 12U and device 12L are stacked back-to-front. For example, isolation structure 16 may bond and/or attach a backside of device 12U to a frontside of device 12L, and isolation structure 16 may be referred to as a bonding layer/structure. FIGS. 1A-IC have been simplified for the sake of clarity to better understand the inventive concepts of the present disclosure. Additional features may be added in stacked device structure 10, and some of the features described below may be replaced, modified, or eliminated in other embodiments of stacked device structure 10.

Upper device 12U and lower device 12L may each include at least one electrically functional device. For example, upper device 12U includes upper transistors 20U (e.g., collectively referring to an upper transistor 20U-1, an upper transistor 20U-2, an upper transistor 20U-3, and an upper transistor 20U-4), and lower device 12L includes lower transistors 20L (e.g., collectively referring to a lower transistor 20L-1, a lower transistor 20L-2, a lower transistor 20L-3, and a lower transistor 20L-4). In FIG. 1A, stacked device structure 10 includes a transistor stack having upper transistor 20U-1 and lower transistor 20L-1, a transistor stack having upper transistor 20U-2 and lower transistor 20L-2, a transistor stack having upper transistor 20U-3 and lower transistor 20L-3, and a transistor stack having upper transistor 20U-4 and lower transistor 20L-4. Upper transistors 20U may be separated and/or electrically isolated from lower transistors 20L by isolation structure 16. In some embodiments, upper transistors 20U and lower transistors 20L are of an opposite conductivity type. For example, upper transistors 20U may be p-type transistors, and lower transistors 20L may be n-type transistors, or vice versa. In such embodiments, a respective upper transistor 20U and a respective lower transistor 20L form a CFET, and a transistor stack may be referred to as a CFET. In some embodiments, upper transistors 20U and lower transistors 20L are of a same conductivity type. For example, upper transistors 20U and lower transistors 20L are of n-type transistors or p-type transistors. In some embodiments, lower transistors 20L and/or upper transistors 20U include transistors of different conductivity types. For example, lower transistors 20L and/or upper transistors 20U may include both n-type transistors and p-type transistors.

Device 12U includes various features and/or components, such as semiconductor layers 26U, gate spacers 44, inner spacers 54, epitaxial source/drains 62U, a contact etch stop layer (CESL) 70U, an interlayer dielectric (ILD) layer 72U, gate dielectrics (e.g., a gate dielectric 78U-1, a gate dielectric 78U-2, a gate dielectric 78U-3, and a gate dielectric 78U-4), gate electrodes (e.g., a gate electrode 80U-1, a gate electrode 80U-2, a gate electrode 80U-3, and a gate electrode 80U-4), and hard masks 92. Device 12L includes various features and/or components, such as mesas 14' (e.g., extensions of substrate 14), semiconductor layers 26L, substrate isolation structures 30, inner spacers 54, epitaxial source/drains 62L, a CESL 70L, an ILD layer 72L, gate dielectrics (e.g., a gate dielectric 78L-1, a gate dielectric 78L-2, a gate dielectric 78L-3, and a gate dielectric 78L-4), and gate electrodes (e.g., a gate electrode 80L-1, a gate electrode 80L-2, a gate electrode 80L-3, and a gate electrode 80L-4). Gate dielectric 78U-1 and gate electrode 80U-1 form an upper gate stack 90U-1 of transistor 20U-1, gate dielectric 78U-2 and gate electrode 80L-2 form an upper gate stack 90U-2 of transistor 20U-2, gate dielectric 78U-3 and gate electrode 80U-3 form an upper gate stack 90U-3 of transistor 20U-3, and gate dielectric 78U-4 and gate electrode 80U-4 form an upper gate stack 90U-4 of transistor 20U-4. Gate dielectric 78L-1 and gate electrode 80L-1 form a lower gate stack 90L-1 of transistor 20L-1, gate dielectric 78L-2 and gate electrode 80L-2 form a lower gate stack 90L-2 of transistor 20L-2, gate dielectric 78L-3 and gate electrode 80L-3 form a lower gate stack 90L-3 of transistor 20L-3, and gate dielectric 78L-4 and gate electrode 80L-4 form a lower gate stack 90L-4 of transistor 20L-4. Gate stack 90U-1 and gate stack 90L-1 may be collectively referred to as a gate 90A, gate stack 90U-2 and gate stack 90L-2 may be collectively referred to as a gate 90B, gate stack 90U-3 and gate stack 90L-3 may be collectively referred to as a gate 90C, and gate stack 90U-4 and gate stack 90L-4 may be collectively referred to as a gate 90D. Gates 90A-90D may be referred to as metal gates or high-k/metal gates of their respective transistor stacks.

Lower transistors 20L are configured as GAA transistors. For example, each lower transistor 20L has two channels (e.g., nanowires, nanosheets, nanobars, etc.) provided by semiconductor layers 26L (also referred to as channel layers or channels), which are suspended over substrate 14 and extend between respective source/drains, such as epitaxial source/drains 62L. In some embodiments, lower transistors 20L include more or less channels (and thus more or less semiconductor layers 26L). Each lower transistor 20L has a respective gate stack disposed over and engaging its semiconductor layers 26L and further disposed between its epitaxial source/drains 62L. For example, transistor 20L-1 has gate stack 90L-1, transistor 20L-2 has gate stack 90L-2, transistor 20L-3 has gate stack 90L-3, and transistor 20L-4 has gate stack 90L-4. Along a gate widthwise direction (FIG. 1A), each gate stack of lower transistors 20L is disposed over a respective top semiconductor layer 26L, between respective semiconductor layers 26L, and between a respective bottom semiconductor layer 26L and substrate 14 (e.g., mesa 14' thereof). Along a gate lengthwise direction (e.g., FIG. 1B and FIG. 1C), each gate stack of lower transistors 20L may wrap around respective semiconductor layers 26L. During operation of the GAA transistors, current may flow through respective semiconductor layers 26L and between respective epitaxial source/drains 62L. In the depicted embodiment, transistor 20L-1 and transistor 20L-2 have a common epitaxial source/drain 62L, transistor 20L-2 and transistor 20L-3 have a common epitaxial source/drain 62L, and transistor 20L-3 and transistor 20L-4 have a common epitaxial source/drain 62L. In some embodiments, lower transistors 20L do not have common epitaxial source/drains 62L. Further, each lower transistor 20L has inner spacers 54 disposed between its gate stack and its epitaxial source/drains 62L.

Upper transistors 20U are also configured as GAA transistors. For example, each upper transistor 20U has two channels (e.g., nanowires, nanosheets, nanobars, etc.) provided by semiconductor layers 26U (also referred to as channel layers or channels), which are suspended over substrate 14 and extend between respective source/drains, such as epitaxial source/drains 62U. In some embodiments, upper transistors 20U includes more or less channels (and thus more or less semiconductor layers 26U). Each upper transistor 20U has a respective gate stack disposed over and engaging its semiconductor layers 26U and further disposed between its epitaxial source/drains 62U. For example, transistor 20U-1 has gate stack 90U-1, transistor 20U-2 has gate stack 90U-2, transistor 20U-3 has gate stack 90U-3, and transistor 20U-4 has gate stack 90U-4. Along a gate widthwise direction, each gate stack of upper transistors 20U is disposed over a respective top semiconductor layer 26U, between respective semiconductor layers 26U, and between a respective bottom semiconductor layer 26U and isolation structure 17. Along a gate lengthwise direction, each gate stack of upper transistors 20U may wrap around respective semiconductor layers 26U. During operation of the GAA transistors, current may flow through respective semiconductor layers 26U and between respective epitaxial source/drains 62U. In the depicted embodiment, transistor 20U-1 and transistor 20U-2 have a common epitaxial source/drain 62U, transistor 20U-2 and transistor 20U-3 have a common epitaxial source/drain 62U, and transistor 20U-3 and transistor 20U-4 have a common epitaxial source/drain 62U. In some embodiments, upper transistors 20U do not have common epitaxial source/drains 62U. Further, each upper transistor 20U has gate spacers 44 disposed along sidewalls of an upper portion of its gate stack, inner spacers 54 disposed between its gate stack and its epitaxial source/drains 62U, and hard masks 92 disposed over its gate stack and between its gate spacers 44. Hard masks 92 may be considered a portion of the gate stacks.

Isolation structure 16 is between channel regions of lower transistors 20L and upper transistors 20U, and isolation structure 16 is between source/drain regions of lower transistors 20L and upper transistors 20U. Isolation structure 16 may provide electrical isolation of both channels/gates and source/drains of stacked transistors. For example, isolation structure 16 separates and/or isolates upper gate stacks (e.g., gate stack 90U-1, gate stack 90U-2, gate stack 90U-3, and gate stack 90U-4) from lower gate stacks (e.g., gate stack 90L-1, gate stack 90L-2, gate stack 90L-3, and gate stack 90L-4, respectively) and upper epitaxial source/drains 62U from lower epitaxial source/drains 62L. In the depicted embodiment, isolation structure 16 extends continuously, without interruption, between both channel regions and source/drain regions of lower transistors 20L and upper transistors 20U. Isolation structure 16 may include a single layer or multiple layers. Isolation structure 16 includes a dielectric material, which may include silicon, oxygen, carbon, nitrogen, other suitable dielectric constituent, or a combination thereof (e.g., silicon oxide, silicon nitride, silicon oxynitride, silicon carbide, silicon carbonitride, silicon oxycarbide, silicon oxycarbonitride, or a combination thereof).

Substrate 14, semiconductor layers 26U, and semiconductor layers 26L include an elementary semiconductor, such as silicon and/or germanium; a compound semiconductor, such as silicon carbide, gallium arsenide, gallium phosphide, indium phosphide, indium arsenide, indium antimonide, or a combination thereof; an alloy semiconductor, such as SiGe, GaAsP, AlInAs, AlGaAs, GaInAs, GaInP, GaInAsP, or a combination thereof; or a combination thereof. In the depicted embodiment, substrate 14, semiconductor layers 26U, and semiconductor layers 26L include silicon. In some embodiments, semiconductor layers 26U and semiconductor layers 26L include different semiconductor materials, such as silicon and silicon germanium, respectively, or vice versa. In some embodiments, substrate 14 is a semiconductor-on-insulator substrate, such as a silicon-on-insulator substrate, a silicon germanium-on-insulator substrate, or a germanium-on-insulator substrate. Substrate 14 (including mesas 14') may include various doped regions, such as p-wells and n-wells. The n-wells are doped with n-type dopants, such as phosphorus, arsenic, other n-type dopant, or a combination thereof. The p-wells are doped with p-type dopants, such as boron, indium, other p-type dopant, or a combination thereof. Semiconductor layers 26U and/or semiconductor layers 26L may also include p-type dopants, n-type dopants, or a combination thereof. For ease of description, semiconductor layers 26U and semiconductor layers 26L may be collectively referred to as semiconductor layers 26.

Gate spacers 44 are disposed along sidewalls of top portions of upper gate stacks (e.g., gate stack 90U-1, gate stack 90U-2, gate stack 90U-3, and gate stack 90U-4), inner spacers 54 are disposed under gate spacers 44 along sidewalls of upper gate stacks and/or lower gate stacks (e.g., gate stack 90L-1, gate stack 90L-2, gate stack 90L-3, and gate stack 90L-4), and fin/mesa spacers may be disposed along sidewalls of mesas 14'. Inner spacers 54 are between semiconductor layers 26U, between semiconductor layers 26L, between bottom semiconductor layers 26U and isolation structure 16, and between bottom semiconductor layers 26L and mesas 14'. Gate spacers 44, inner spacers 54, and fin spacers include a dielectric material, which may include silicon, oxygen, carbon, nitrogen, other suitable dielectric constituent, or a combination thereof (e.g., silicon oxide, silicon nitride, silicon oxynitride, silicon carbide, silicon carbonitride, silicon oxycarbide, silicon oxycarbonitride, or a combination thereof). Gate spacers 44, inner spacers 44, and fin spacers may include different materials and/or different configurations (e.g., different numbers of layers). In some embodiments, gate spacers 44, inner spacers 54, fin spacers, or a combination thereof have a multilayer structure. In some embodiments, gate spacers 44, inner spacers 54, fin spacers, or a combination thereof include more than one set of spacers, such as seal spacers, offset spacers, sacrificial spacers, dummy spacers, main spacers, or a combination thereof. The various sets of spacers may have different compositions.

Each of gates 90A-90D is disposed between respective epitaxial source/drain stacks. An epitaxial source/drain stack includes a respective epitaxial source/drain 62U, a respective epitaxial source/drain 62L, and isolation structure 17 therebetween. Epitaxial source/drains 62L and epitaxial source/drains 62U may be doped with n-type dopants and/or p-type dopants. In some embodiments, epitaxial source/drains 62L and/or epitaxial source/drains 62U include silicon doped with carbon, phosphorous, arsenic, other n-type dopant, or a combination thereof (e.g., Si:C epitaxial source/drains, Si:P epitaxial source/drains, or Si:C:P epitaxial source/drains). In some embodiments, epitaxial source/drains 62L and/or epitaxial source/drains 62U include silicon germanium or germanium, which is doped with boron, other p-type dopant, or a combination thereof (e.g., Si:Ge:B epitaxial source/drains). Epitaxial source/drains 62L and epitaxial source/drains 62U may have the same or different compositions and/or materials depending on configurations of their respective transistors. For example, where upper transistors 20U are PFETs and lower transistors 20L are NFETs, epitaxial source/drains 62L may include silicon doped with phosphorous and/or carbon, and epitaxial source/drains 62U may include silicon germanium doped with boron. In some embodiments, epitaxial source/drains 62L and/or epitaxial source/drains 62U include more than one epitaxial semiconductor layer, where the epitaxial semiconductor layers may include the same or different materials and/or the same or different dopant concentrations. In some embodiments, epitaxial source/drains 62L and/or epitaxial source/drains 62U include materials and/or dopants that achieve desired tensile stress and/or compressive stress in adjacent channel regions (e.g., semiconductor layers 26U and/or semiconductor layers 26L). As used herein, source/drain region, epitaxial source/drain, epitaxial source/drain feature, etc. may refer to a source of a device (e.g., a source of one of upper transistors 20U or one of lower transistors 20L), a drain of a device (e.g., a drain of one of upper transistors 20U or one of lower transistors 20L), or a source and/or a drain of multiple devices.

ILD layer 72U and ILD layer 72L include a dielectric material including, for example, silicon oxide, carbon doped silicon oxide, silicon nitride, silicon oxynitride, tetraethyl orthosilicate (TEOS)-formed oxide, boron silicate glass (BSG), phosphosilicate glass (PSG), borophosphosilicate glass (BPSG), fluorosilicate glass (FSG), xerogel, aerogel, amorphous fluorinated carbon, parylene, benzocyclobutene-based (BCB) dielectric material, polyimide, other suitable dielectric material, or a combination thereof. In some embodiments, ILD layer 72U and/or ILD layer 72L include a dielectric material having a dielectric constant that is less than a dielectric constant of silicon dioxide (e.g., $k<3.9$). In some embodiments, ILD layer 72U and/or ILD layer 72L includes a dielectric material having a dielectric constant that is less than about 2.5 (i.e., an extreme low-k (ELK) dielectric material), such as porous silicon oxide, silicon carbide, carbon-doped oxide (e.g., an SiCOH-based material (having, for example, Si—$CH_3$ bonds)), or a combination thereof, each of which is tuned/configured to have a dielectric constant less than about 2.5. CESL 70L includes a dielectric material that is different than the dielectric material of ILD layer 72L, and CESL 70U includes a dielectric material that is different than the dielectric material of ILD layer 72U. For example, where ILD layer 72U and ILD layer 72L include a low-k dielectric material (e.g., porous silicon oxide), CESL 70L and CESL 70U may include silicon and nitrogen and/or carbon, such as silicon nitride, silicon carbonitride, or silicon oxycarbonitride. In some embodiments, CESL 70L and/or CESL 70U may include metal and oxygen, nitrogen, carbon, or a combination thereof. ILD layer 72U, ILD layer 72L CESL 70L, CESL 70U, or a combination thereof may have a multilayer structure.

Gate dielectrics of the gate stacks each include at least one dielectric gate layer, such as interfacial layers and/or high-k dielectric layers, which are described further below. Gate electrodes of the gate stacks, which are described further below, each include at least one electrically conductive gate layer, such as a work function layer, a metal fill (bulk) layer, additional layers (e.g., a barrier layer and/or one or more capping layers), or a combination thereof, which are described further below. In the depicted embodiment, the gate electrodes include each include a work function layer. The work function layer includes work function metal(s) and/or alloys thereof, such as Ti, Ta, Al, Ag, Mn, Zr, W, Ru, Mo, TiC, TiAl, TiAlC, TiAlSiC, TaC, TaCN, TaSiN, TiSiN, TiN, TaN, TaSN, WN, WCN, $ZrSi_2$, $MoSi_2$, $TaSi_2$, $NiSi_2$, TaAl, TaAlC, TaSiAlC, TiAlN, or a combination thereof. In some embodiments, the work function layer of the gate electrodes is a same type of work function layer (e.g., n-metal or p-metal). In some embodiments, the gate electrodes of upper gate stacks each include a first work function layer, and the gate electrodes of lower gate stacks each include a second work function layer. The first work function layer and the second work function layer may include different type work function layers (e.g., p-metal and n-metal, respectively). In some embodiments, the metal fill layer includes Al, W, Cu, Ti, Ta, TiN, TaN, polysilicon, other metal(s), alloys thereof, or a combination thereof. In some embodiments, the barrier layer includes a material that prevents or eliminates diffusion and/or reaction of constituents between adjacent layers and/or promotes adhesion between adjacent layers, such as between the work function layer and the metal layer. The barrier layer may include metal and nitrogen, such as titanium nitride, tantalum nitride, tungsten nitride (e.g., $W_2N$), titanium silicon nitride (TiSiN), tantalum silicon nitride (TaSiN), other suitable metal nitride, or a combination thereof.

Hard masks 92 include a material that is different than ILD layer 72U and/or subsequently formed ILD layers to achieve etch selectivity during subsequent etching processes. In some embodiments, hard masks 92 include silicon and nitrogen and/or carbon, such as silicon nitride, silicon oxynitride, silicon carbide, silicon oxycarbide, silicon carbonitride, silicon oxycarbonitride, other silicon nitride, other silicon carbide, or a combination thereof. In some embodiments, hard masks 92 include metal and oxygen and/or nitrogen, such as aluminum oxide (e.g., AlO or $Al_2O_3$), aluminum nitride (e.g., AlN), aluminum oxynitride (e.g., AlON), zirconium oxide, zirconium nitride, hafnium oxide (e.g., HfO or $HFO_2$), zirconium aluminum oxide (e.g., ZrAlO), other metal oxide, other metal nitride, or a combination thereof.

Substrate isolation structures 30 may electrically isolate active device regions and/or passive device regions. For example, substrate isolation structures 30 may separate and electrically isolate an active region, such as mesa 14' and/or epitaxial source/drains 62L, from other device regions/devices. Substrate isolation structures 30 includes silicon oxide, silicon nitride, silicon oxynitride, other suitable isolation material (including, silicon, oxygen, nitrogen, carbon, other suitable isolation constituent, or a combination thereof), or a combination thereof. Substrate isolation structures 30 may have a multilayer structure. For example, substrate isolation structures 30 may include a bulk dielectric (e.g., an oxide layer) over a dielectric liner (e.g., silicon nitride, silicon oxide, silicon oxynitride, silicon oxycarbonitride, or a combination thereof). In another example, substrate isolation structures 30 include a bulk dielectric over a doped liner, such as a boron silicate glass (BSG) liner and/or a phosphosilicate glass (PSG) liner. Dimensions and/or characteristics of substrate isolation structures 30 are configured to provide shallow trench isolation (STI) structures, deep trench isolation (DTI) structures, local oxidation of silicon (LOCOS) structures, other suitable isolation structures, or a combination thereof.

Figure 2:
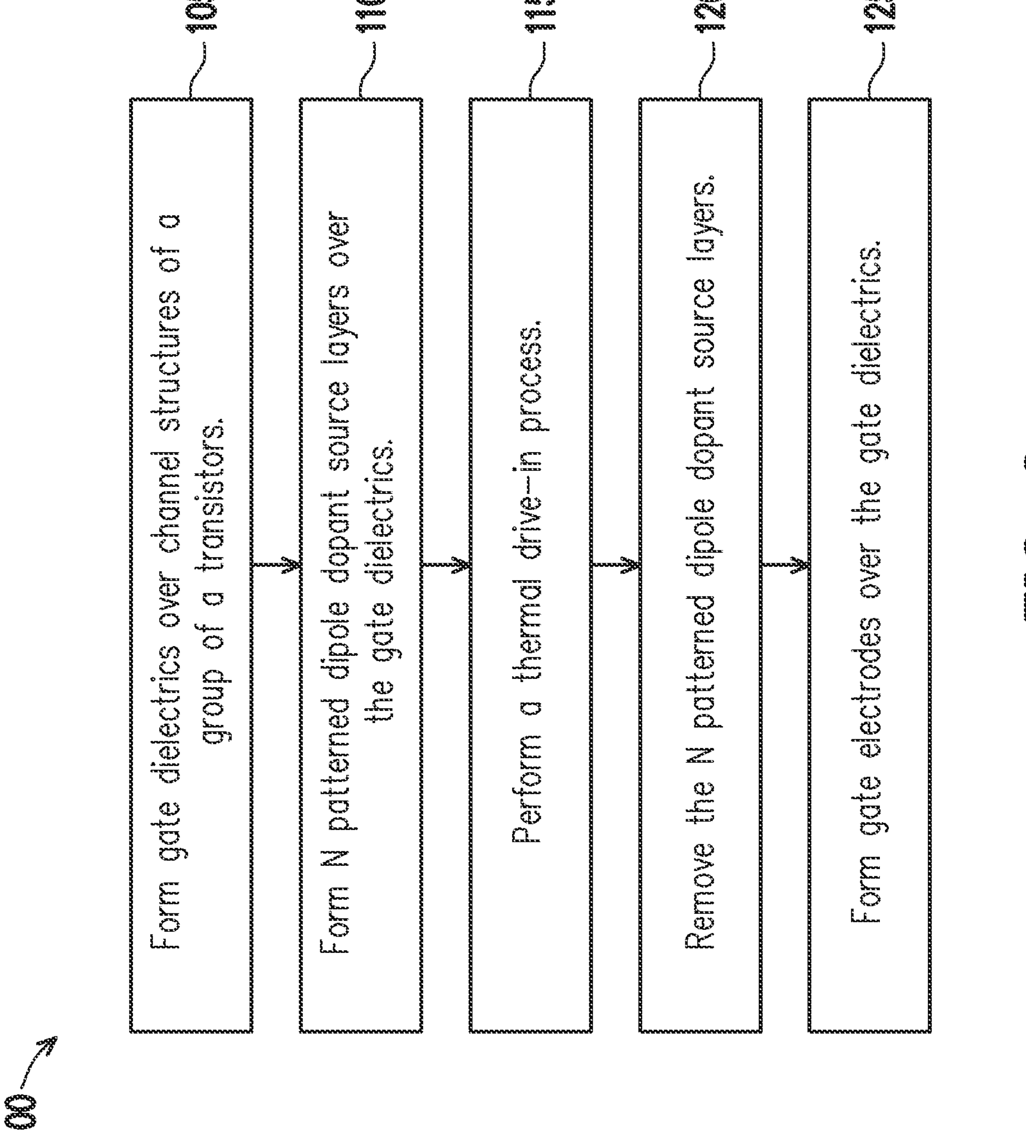
FIG. 2 is a flow chart of a method for fabricating gate stacks of transistors of a given level of a stacked transistor structure, such as gate stacks of lower transistors or upper transistors of the stacked device structure of FIG. 1A, according to various aspects of the present disclosure.

FIG. 2 is a flow chart of a method 100 for fabricating gate stacks of transistors of a given level of a stacked transistor structure, such as gate stacks of lower transistors thereof or gate stacks of upper transistors thereof, according to various aspects of the present disclosure. For a given set of transistors, method 100 implements one patterned dipole dopant source layer to provide a given set of transistors with two different threshold voltages. N patterned dipole dopant source layers may thus be implemented to provide the given set of transistors with $2^N$ threshold voltages, where N is an integer, N is greater than 0, and each of the N patterned dipole dopant source layers has a different pattern, such that each of the N patterned dipole dopant source layers covers gate dielectrics of a different combination of transistors. For example, if the given set of transistors has eight transistors, each of the eight transistors may be provided with one of two threshold voltages by using one patterned dipole dopant source layer (i.e., N=1, threshold voltages=$2^N=2^1=2$), one of four threshold voltages by using two patterned dipole dopant source layers (i.e., N=2, threshold voltages=$2^N=2^2=4$), or one of eight threshold voltages by using three patterned dipole dopant source layers (i.e., N=3, threshold voltages=$2^N=2^3=8$) during a dipole engineering process. For purposes of discussion and case of understanding, method 100 is described in the context of fabricating gate stacks of lower transistors 20L of stacked device structure 10. For example, method 100 is implemented to form gate stack 90L-1 of transistor 20L-1, gate stack 90L-2 of transistor 20L-2, gate stack 90L-3 of transistor 20L-3, and gate stack 90L-4 of transistor 20L-4. FIG. 2 has been simplified for the sake of clarity to better understand the inventive concepts of the present disclosure. Additional steps can be provided before, during, and after method 100, and some of the steps described can be moved, replaced, or eliminated for additional embodiments of method 100.

Method 100 includes forming gate dielectrics (e.g., high-k dielectric layers thereof) over channel structures of a group of transistors at block 105, forming N patterned dipole dopant source layers over the gate dielectrics at block 110, performing a thermal drive-in process at block 115, removing the N patterned dipole dopant source layers at block 120, and forming gate electrodes over the gate dielectrics at block 125. Each of the N patterned dipole dopant source layers covers gate dielectrics of some transistors of the group of transistors, but not gate dielectrics of other transistors of the group of transistors. The N patterned dipole dopant source layers have different patterns. In some embodiments, each of the N patterned dipole dopant source layers may cover a unique combination of transistors of the group of transistors, and each of the N patterned dipole dopant source layers may cover/expose at least one transistor covered/exposed by another of the N patterned dipole dopant source layers.

The thermal drive-in process drives dipole dopant from the N patterned dipole dopant source layers into gate dielectrics covered by the N patterned dipole dopant source layers. In some embodiments, a thermal drive-in process is performed on one of the N patterned dipole dopant source layers at a time. For example, when N=2, method 100 may include forming a first patterned dipole dopant source layer having a first pattern over the gate dielectrics of the group of transistors, performing a first thermal drive-in process to drive first dipole dopant into gate dielectrics covered by the first patterned dipole dopant source layer, removing the first patterned dipole dopant source layer, forming a second patterned dipole dopant source layer having a second pattern over the gate dielectrics of the group of transistors, performing a second thermal drive-in process to drive second dipole dopant into gate dielectrics covered by the second patterned dipole dopant source layer, and removing the second patterned dipole dopant source layer. In some embodiments, a thermal drive-in process is performed on more than one of the N patterned dipole dopant source layers. For example, when N=2, method 100 may include forming a first patterned dipole dopant source layer having a first pattern over the gate dielectrics of the group of transistors, forming a second patterned dipole dopant source layer having a second pattern over the gate dielectrics of the group of transistors and the first patterned dipole dopant source layer, performing a thermal drive-in process to drive second dipole dopant and the first dipole dopant into gate dielectrics covered by the second patterned dipole dopant source layer and/or the first patterned dipole dopant source layer, and removing the second patterned dipole dopant source layer and the first patterned dipole dopant source layer.

Figure 3:
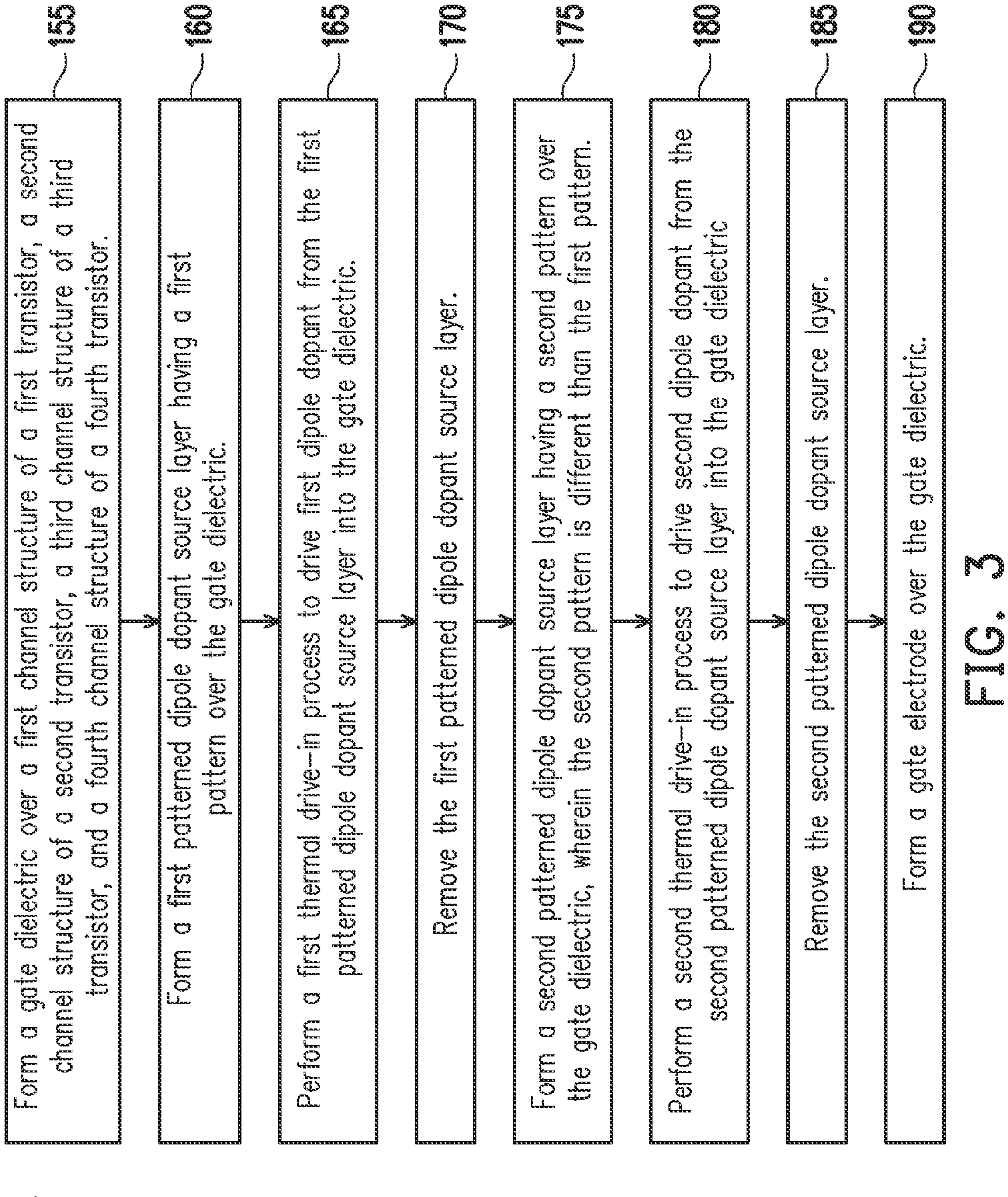
FIG. 3 is a flow chart of a method for fabricating gate stacks of four transistors of a given level of a stacked transistor structure, such as stacked device structure of FIG. 1A, according to various aspects of the present disclosure.

FIG. 3 is a flow chart of a method 150 for fabricating gate stacks of four transistors of a given level of a stacked transistor structure, such as gate stacks of lower transistors 20L of a lower (or bottom) level of stacked device structure 10, according to various aspects of the present disclosure. Method 150 provides a specific implementation of method 100. For example, method 150 implements two patterned dipole dopant source layers (i.e., N=2) to provide the four transistors with four different threshold voltages ($2^N=2^2=4$). FIGS. 4A-4H are schematic views of a given level of a stacked transistor structure, such as the lower level of stacked device structure 10 (i.e., lower transistors 20L of device 12L), in portion or entirety, at various fabrication stages associated with method 150 of FIG. 3, according to various aspects of the present disclosure. FIG. 3 and FIGS. 4A-4H are discussed concurrently herein for ease of description and understanding. FIG. 3 and FIGS. 4A-4H have been simplified for the sake of clarity to better understand the inventive concepts of the present disclosure. For example, some features are consolidated into and represented by a single feature in FIGS. 4A-4H (e.g., channel layers of a given transistor are consolidated into and represented by a channel structure), and some features are omitted in FIGS. 4A-4H. Additional steps may be provided before, during, and after method 150, and some of the steps described may be moved, replaced, or eliminated for additional embodiments of method 150. Additional features may be added in the stacked device structure of FIGS. 4A-4H, and some of the features described below may be replaced, modified, or eliminated in other embodiments of the stacked device structure of FIGS. 4A-4H.

Figures 4A, 4B, 4C, 4D:
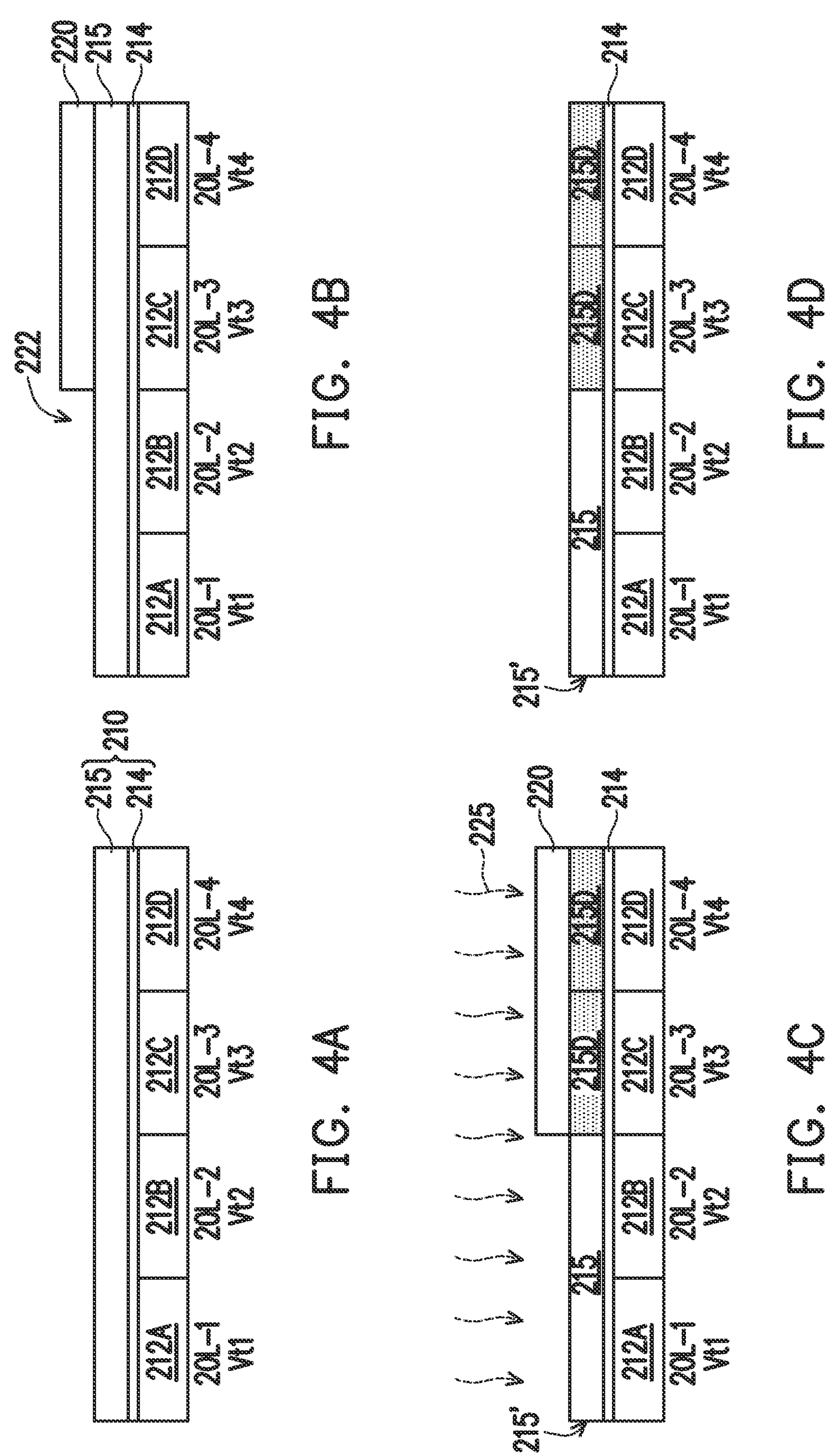
FIGS. 4A-4H are schematic views of a given level of a stacked transistor structure, such as a lower level of stacked device structure of FIG. 1A, at various fabrication stages of the method of FIG. 3, according to various aspects of the present disclosure.

Referring to FIG. 3 and FIG. 4A, method 150 at block 155 includes forming a gate dielectric 210 over a first channel structure 212A of a first transistor (e.g., transistor 20L-1), a second channel structure 212B of a second transistor (e.g., transistor 20L-2), a third channel structure 212C of a third transistor (e.g., transistor 20L-3), and a fourth channel structure 212D of a fourth transistor (e.g., transistor 20L-4). Channel structure 212A represents semiconductor layers 26L of transistor 20L-1, channel structure 212B represents semiconductor layers 26L of transistor 20L-2, channel structure 212C represents semiconductor layers 26L of transistor 20L-3, and channel structure 212D represents semiconductor layers 26L of transistor 20L-4.

Gate dielectric 210 includes an interfacial layer 214 and a high-k dielectric layer 215. In Y-Z cross-sectional views (e.g., FIG. 1B and FIG. 1C), gate dielectric 210 (e.g., interfacial layer 214 and high-k dielectric layer 215 thereof) may surround semiconductor layers 26L, gate dielectric 210 (e.g., interfacial layer 214 and high-k dielectric layer 215 thereof) may wrap mesas 14', and gate dielectric 210 (e.g., high-k dielectric layer 215 thereof) may extend over tops of substrate isolation structures 30. In X-Z cross-sectional views (e.g., FIG. 1A), gate dielectric 210 (e.g., interfacial layer 214 and high-k dielectric layer 215 thereof) may cover tops and bottoms of semiconductor layers 26L and tops of mesas 14'. In some embodiments, in X-Z cross-sectional views, portions of gate dielectric 210 (e.g., high-k dielectric layer 215 thereof) over top semiconductor layers 26L may have u-shaped profiles. In embodiments where gate dielectric 210 is formed during a gate replacement process, high-k dielectric layer 215 is formed over interfacial layer 214, interfacial layer 214 and high-k dielectric layer 215 partially fill gate openings that expose channel structures 212A-212D, interfacial layer 214 and high-k dielectric layer 215 partially fill gaps between semiconductor layers 26L, and interfacial layer 214 and high-k dielectric layer 215 partially fill gaps between bottom semiconductor layers 26L and mesas 14'. In some embodiments, gate dielectric 210 may not include interfacial layer 214. In such embodiments, high-k dielectric layer 215 is disposed directly on semiconductor layers 26L and mesas 14'.

Interfacial layer 214 includes a dielectric material, such as $SiO_2$, $SiGeO_x$, HfSiO, SiON, other dielectric material, or a combination thereof. In some embodiments, interfacial layer 214 is a group IV-based oxide layer, which generally refers to an oxide of a group IV-based material (i.e., a material that includes at least one group IV element, such as Si, Ge, C, etc.). In some embodiments, interfacial layer 214 is a group III-V-based oxide layer, which generally refers to an oxide of a group III-V-based material (i.e., a material that includes at least one group III element, such as Al, Ga, In, B, etc., and at least one group V element, such as N, P, As, Sb, etc.). Interfacial layer 214 is formed by thermal oxidation, chemical oxidation, atomic layer deposition (ALD), chemical vapor deposition (CVD), other suitable process, or a combination thereof. Interfacial layer 214 may form on semiconductor surfaces (e.g., semiconductor layers 26L), but not dielectric surfaces (e.g., isolation structure 16 and/or substrate isolation structures 30). In some embodiments, interfacial layer 214 has a substantially uniform thickness.

High-k dielectric layer 215 includes a high-k dielectric material, which generally refers to dielectric materials having a dielectric constant that is greater than a dielectric constant of silicon dioxide ($k\approx3.9$), such as $HfO_2$, HfSiO, $HfSiO_4$, HfSiON, HfLaO, HfTaO, HfTIO, HfZrO, $HfAlO_x$, ZrO, $ZrO_2$, $ZrSiO_2$, AlO, AlSiO, $Al_2O_3$, TiO, $TiO_2$, LaO, LaSiO, $LaO_3$, $La_2O_3$, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3P_4$, $HfO_2$—$Al_2O_3$, other high-k dielectric material, or a combination thereof. In some embodiments, high-k dielectric layer 215 is a hafnium-based oxide (e.g., $HfO_x$, such as $HfO_2$) layer. In some embodiments, high-k dielectric layer 215 is a zirconium-based oxide (e.g., $ZrO_x$, such as $ZrO_2$) layer. In some embodiments, high-k dielectric layer 215 has a multilayer structure. High-k dielectric layer 215 is formed by ALD, CVD, physical vapor deposition (PVD), an oxide-based deposition process, other suitable process, or a combination thereof. A thickness of high-k dielectric layer 215 is greater than a thickness of interfacial layer 214. In some embodiments, high-k dielectric layer 215 has a substantially uniform thickness, such as depicted.

Referring to FIG. 3 and FIG. 4B, method 100 at block 160 includes forming a first patterned dipole dopant source layer having a first pattern (e.g., a patterned dipole dopant source layer 220) over gate dielectric 210 (e.g., high-k dielectric layer 215 thereof). Patterned dipole dopant source layer 220 covers gate dielectric 210 of some transistors and exposes gate dielectric 210 of other transistors. For example, patterned dipole dopant source layer 220 has an opening 222 therein that exposes high-k dielectric layer 215 of transistor 20L-1 and transistor 20L-2, but not high-k dielectric layer 215 of transistor 20L-3 and transistor 20L-4. Though opening 222 is depicted as a single opening for ease of understanding and simplicity, it is understood that opening 222 may be a first opening that exposes high-k dielectric layer 215 of transistor 20L-1 and a second opening that exposes high-k dielectric layer 215 of transistor 20L-2. The first opening and the second opening may be separate and discrete from one another.

In Y-Z cross-sectional views, patterned dipole dopant source layer 220 may surround semiconductor layers 26L and wrap mesas 14' of transistor 20L-3 and transistor 20L-4, and patterned dipole dopant source layer 220 may extend over tops of substrate isolation structures 30. Sec, e.g., FIG. 1B and FIG. 1C, which depict a stacked device structure after forming gate dielectrics (e.g., gate dielectric 78L-1 and gate dielectric 78L-3), performing dipole engineering, such as described with reference to FIGS. 4B-4G, and forming gate electrodes (e.g., gate electrode 80L-1 and gate electrode 80L-3). Patterned dipole dopant source layer 220 may be disposed over gate dielectric 210, may surround semiconductor layers 26L, and may wrap mesas 14' of transistor 20L-3 and transistor 20L-4 in a manner similar to gate dielectric 78L-1 and gate dielectric 78L-3, and patterned dipole dopant source layer 220 may extend over tops of substrate isolation structures 30 in a manner similar to gate dielectric 78L-1 and gate dielectric 78L-3. In X-Z cross-sectional views, patterned dipole dopant source layer 220 may cover tops and bottoms of semiconductor layers 26L and tops of mesas 14' of transistor 20L-3 and transistor 20L-4. In some embodiments, in X-Z cross-sectional views, patterned dipole dopant source layer 220 over tops of semiconductor layers 26L may have a u-shaped profile. In embodiments where patterned dipole dopant source layer 220 is formed during a gate replacement process, patterned dipole dopant source layer 220 may partially fill or fill a remainder of the gate openings that expose channel structure 212C and channel structure 212D, and patterned dipole dopant source layer 220 may partially fill or fill a remainder of gaps between semiconductor layers 26L and/or gaps between bottom semiconductor layers 26L and mesas 14'.

Forming patterned dipole dopant source layer 220 may include depositing first dipole dopant source layers over high-k dielectric layers (e.g., high-k dielectric layer 215) of a group of transistors and performing a patterning process to remove first dipole dopant source layers disposed over high-k dielectric layers of some transistors of the group of transistors. A first dipole dopant source layer is deposited by ALD, CVD, other suitable process, or a combination thereof, and a composition of the first dipole dopant source layer is different than a composition of high-k dielectric layer 215 to enable selective removal thereof. The patterning process includes a lithography process and/or an etching process. The lithography process may include forming a patterned mask layer that covers the first dipole dopant source layer over some transistors (e.g., transistor 20L-3 and transistor 20L-4) and exposes the first dipole dopant source layer over other transistors (e.g., transistor 20L-1 and transistor 20L-2). For example, the patterned mask layer has openings therein that overlap transistor 20L-1 and transistor 20L-2, but not transistor 20L-3 and transistor 20L-4. The etching process may include transferring a pattern in the patterned mask layer to the first dipole dopant source layer, for example, by removing portions of the first dipole dopant source layer that are exposed by the openings in the patterned mask layer. The etching process is a dry etch, a wet etch, other suitable etching process, or a combination thereof. The etching process may selectively remove the first dipole dopant source layer with respect to high-k dielectric layer 215 and/or the patterned mask layer. In some embodiments, the etching process removes the patterned mask layer, in portion or entirety, from over the dielectric layer. In some embodiments, after the etching process, the patterned mask layer is removed by an etching process and/or a resist stripping process.

Patterned dipole dopant source layer 220 includes first dipole dopant(s) (e.g., metal) and oxygen, nitrogen, carbon, or a combination thereof (e.g., a non-metal). The first dipole dopant may be driven into high-k dielectric layer 215 to change a threshold voltage of one or more transistors. For example, driving first dipole dopant into high-k dielectric layer 215 may increase or decrease a threshold voltage of a transistor depending on transistor type (e.g., n-type or p-type) and dipole type (e.g., n-type or p-type). In some embodiments, patterned dipole dopant source layer 220 is a metal oxide layer, and the first dipole dopant is n-dipole dopant. The n-dipole dopant may be lanthanum (La), yttrium (Y), lutetium (Lu), strontium (Sr), erbium (Er), magnesium (Mg), other suitable n-dipole dopant, or a combination thereof. For an n-type transistor, driving n-dipole dopant into its high-k dielectric layer may decrease the n-type transistor's threshold voltage, while for a p-type transistor, driving n-dipole dopant into its high-k dielectric layer may increase the p-type transistor's threshold voltage. In some embodiments, the n-dipole dopant is lanthanum, and patterned dipole dopant source layer 220 is a lanthanum oxide layer (e.g., an $La_2O_3$ layer). In some embodiments, the n-dipole dopant is strontium, and patterned dipole dopant source layer 220 is a strontium oxide layer (e.g., an SrO layer). In some embodiments, the n-dipole dopant is yttrium, and patterned dipole dopant source layer 220 is an yttrium oxide layer (e.g., $Y_2O_3$ layer). In some embodiments, the n-dipole dopant is lutetium, and patterned dipole dopant source layer 220 is a lutetium oxide layer (e.g., an $Lu_2O_3$ layer). In some embodiments, patterned dipole dopant source layer 220 is a metal oxide layer, and the first dipole dopant is p-dipole dopant. The p-dipole dopant may be aluminum (Al), titanium (Ti), zinc (Zn), other suitable p-dipole dopant, or a combination thereof. In some embodiments, patterned dipole dopant source layer 220 includes n-dipole dopant and p-dipole dopant. In some embodiments, a metal of patterned dipole dopant source layer 220 (i.e., n-dipole dopant and/or p-dipole dopant) is different than a high-k dielectric metal of high-k dielectric layer 215. Patterned dipole dopant source layer 220 may have a substantially uniform thickness.

Referring to FIG. 3 and FIG. 4C, method 100 at block 165 includes performing a first thermal drive-in process to drive first dipole dopant from the first patterned dipole dopant source layer into gate dielectric 210, thereby providing a dipole-engineered high-k dielectric layer 215'. In FIG. 4C, a thermal drive-in process 225 drives (diffuses) n-dipole dopant and/or p-dipole dopant (e.g., metal atoms) from patterned dipole dopant source layer 220 into high-k dielectric layer 215. Thermal drive-in process 225 may be an annealing process, such as a rapid thermal annealing (RTA), a millisecond annealing (MSA), a microsecond annealing (USA), a microwave annealing, a laser annealing, a spike annealing, a soak annealing, a furnace annealing, other suitable annealing process, or a combination thereof. Parameters of thermal drive-in process 225 (e.g., drive-in temperature, time, ambient, pressure, etc.) are tuned to provide covered portions of high-k dielectric layer 215 with desired dipole dopant concentrations and/or desired dipole dopant profiles. Thermal drive-in parameters, such as temperature, are selected to sufficiently cause the first dipole dopant to diffuse into high-k dielectric layer 215 and yet ensure that thermal drive-in process 225 does not adversely affect (e.g., damage) gate dielectric 210, channel structures 212A-212D, other device features, or a combination thereof.

Because thermal drive-in process 225 diffuses dipole dopant into covered portions of high-k dielectric layer 215 (i.e., portions having patterned dipole dopant source layer 220 thereon) but not into uncovered, exposed portions of high-k dielectric layer 215, compositions of covered portions of high-k dielectric layer 215 change, while compositions of exposed portions of high-k dielectric layer 215 do not (or negligibly) change. For example, high-k dielectric layer 215 of transistor 20L-3 and transistor 20L-4 include first dipole dopant, while high-k dielectric layer 215 of transistor 20L-1 and transistor 20L-2 does not include first dipole dopant. High-k dielectric layer 215 of transistor 20L-3 and transistor 20L-4 thus become high-k dielectric layers 215D. In some embodiments, high-k dielectric layer 215 includes high-k dielectric metal (e.g., hafnium and/or zirconium) and oxygen, and high-k dielectric layers 215D include the high-k dielectric metal, oxygen, and first dipole metal (e.g., n-dipole metal and/or p-dipole metal, which may be different than the high-k dielectric metal). In some embodiments, thermal drive-in process 225 diffuses the first dipole dopant from patterned dipole dopant source layer 220 to an interface between interfacial layer 214 and covered portions of high-k dielectric layer 215 and/or into portions of interfacial layer 214 covered by patterned dipole dopant source layer 220. In such embodiments, compositions of interfacial layers 214 of transistor 20L-3 and transistor 20L-4 may be different than compositions of interfacial layers 214 of transistor 20L-1 and transistor 20L-2. For example, interfacial layers 214 of transistor 20L-3 and transistor 20L-4 may include silicon, oxygen, and the first dipole metal, while interfacial layers 214 of transistor 20L-1 and transistor 20L-2 may include silicon and oxygen, but no (or negligible) first dipole metal.

Referring to FIG. 3 and FIG. 4D, method 100 at block 170 includes removing first patterned dipole dopant source layer 220. In some embodiments, an etching process selectively removes patterned dipole dopant source layer 220 with respect to dipole-engineered high-k dielectric layer 215'. For example, the etching process etches patterned dipole dopant source layer 220 with no (or negligible) etching of high-k dielectric layer 215 and high-k dielectric layers 215D. An etchant of the etching process may etch patterned dipole dopant source layer 220 (e.g., a metal oxide having a first composition) at a higher rate than high-k dielectric layer 215 and high-k dielectric layers 215D (e.g., metal oxides having a second composition and a third composition, respectively, that are different than the first composition). The etching process is a dry etch, a wet etch, other suitable etch, or a combination thereof.

Figures 4E, 4F, 4G, 4H:
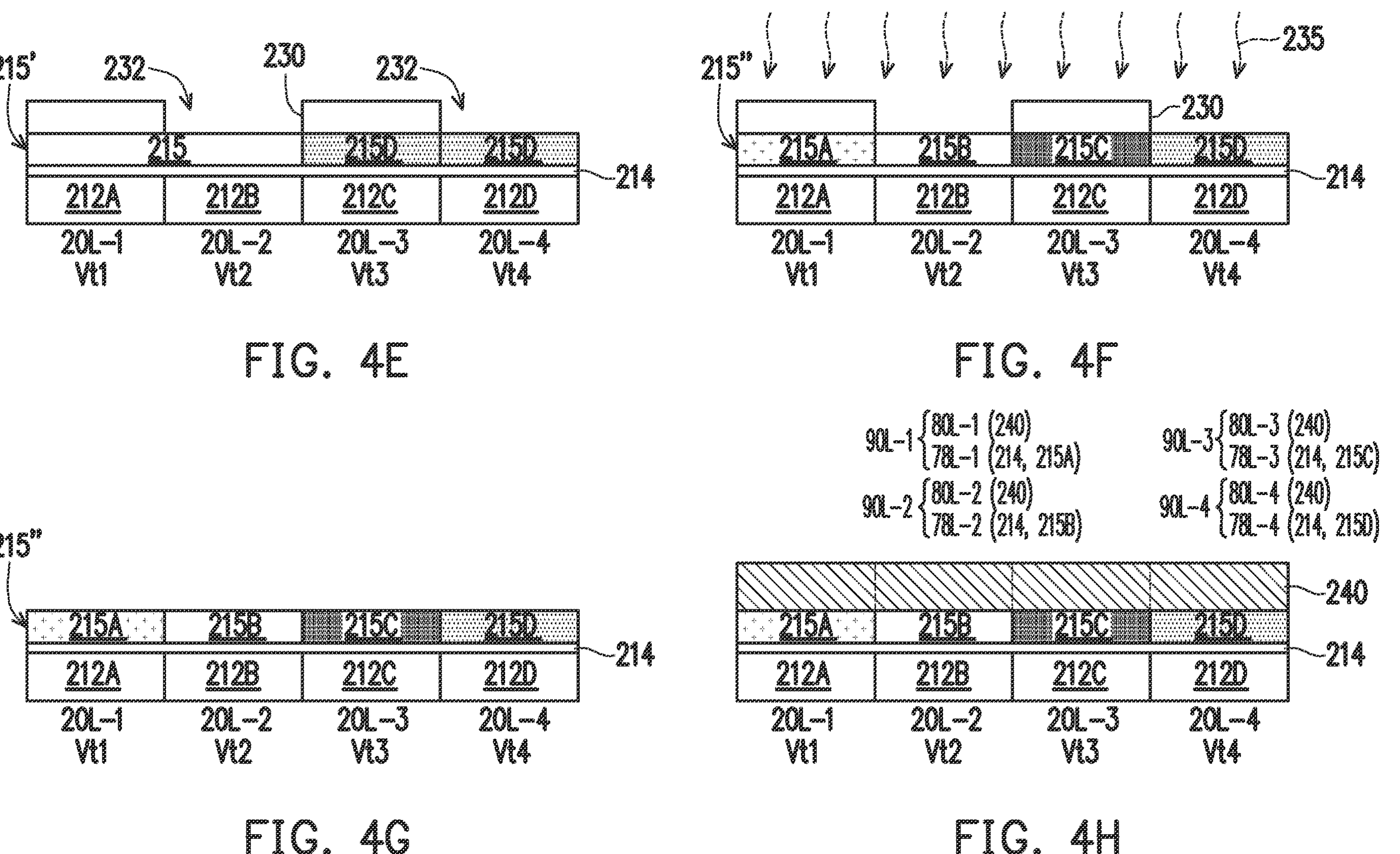

Referring to FIG. 3 and FIG. 4E, method 100 at block 175 includes forming a second patterned dipole dopant source layer having a second pattern (e.g., a patterned dipole dopant source layer 230) over gate dielectric 210 (e.g., dipole-engineered high-k dielectric layer 215' thereof). Patterned dipole dopant source layer 230 covers gate dielectric 210 of some transistors and exposes gate dielectric 210 of other transistors. The second pattern of patterned dipole dopant source layer 230 is different than the first pattern of patterned dipole dopant source layer 220, such that a group of transistors covered by patterned dipole dopant source layer 230 is different than a group of transistors covered by patterned dipole dopant source layer 220. In other words, patterned dipole dopant source layer 230 covers/exposes at least one transistor that was not covered/exposed by patterned dipole dopant source layer 220. For example, patterned dipole dopant source layer 230 has openings 232 therein that expose high-k dielectric layer 215 of transistor 20L-2 and high-k dielectric layer 215D of transistor 20L-4, but not high-k dielectric layer 215 of transistor 20L-1 and high-k dielectric layer 215D of transistor 20L-3.

In Y-Z cross-sectional views, patterned dipole dopant source layer 230 may surround semiconductor layers 26L and wrap mesas 14' of transistor 20L-1 and transistor 20L-3, and patterned dipole dopant source layer 230 may extend over tops of substrate isolation structures 30. Sec, e.g., FIG. 1B and FIG. 1C, which depict a stacked device structure after forming gate dielectrics (e.g., gate dielectric 78L-1 and gate dielectric 78L-3), performing dipole engineering, such as described with reference to FIGS. 4B-4G, and forming gate electrodes (e.g., gate electrode 80L-1 and gate electrode 80L-3). Patterned dipole dopant source layer 230 may be disposed over gate dielectric 210, may surround semiconductor layers 26L, and may wrap mesas 14' of transistor 20L-1 and transistor 20L-3 in a manner similar to gate dielectric 78L-1 and gate dielectric 78L-3, and patterned dipole dopant source layer 230 may extend over tops of substrate isolation structures 30 in a manner similar to gate dielectric 78L-1 and gate dielectric 78L-3. In X-Z cross-sectional views, patterned dipole dopant source layer 230 may cover tops and bottoms of semiconductor layers 26L and tops of mesas 14' of transistor 20L-1 and transistor 20L-3. In some embodiments, in X-Z cross-sectional views, patterned dipole dopant source layer 230 over tops of semiconductor layers 26L may have a u-shaped profile. In embodiments where patterned dipole dopant source layer 230 is formed during a gate replacement process, patterned dipole dopant source layer 230 may partially fill or fill a remainder of the gate openings that expose channel structure 212A and channel structure 212C, and patterned dipole dopant source layer 230 may partially fill or fill a remainder of gaps between semiconductor layers 26L and/or gaps between bottom semiconductor layers 26L and mesas 14'.

Forming patterned dipole dopant source layer 230 may include depositing second dipole dopant source layers over high-k dielectric layers (e.g., dipole-engineered high-k dielectric layer 215') of a group of transistors and performing a patterning process to remove second dipole dopant source layers disposed over high-k dielectric layers of some transistors of the group of transistors. A second dipole dopant source layer is deposited by ALD, CVD, other suitable process, or a combination thereof, and a composition of the second dipole dopant source layer is different than a composition of dipole-engineered high-k dielectric layer 215' to enable selective removal thereof. The patterning process includes a lithography process and/or an etching process. The lithography process may include forming a patterned mask layer that covers the second dipole dopant source layer over some transistors (e.g., transistor 20L-1 and transistor 20L-3) and exposes the second dipole dopant source layer over other transistors (e.g., transistor 20L-2 and transistor 20L-4). For example, the patterned mask layer has openings therein that overlap transistor 20L-2 and transistor 20L-4, but not transistor 20L-1 and transistor 20L-3. The etching process may include transferring a pattern in the patterned mask layer to the second dipole dopant source layer, for example, by removing portions of the second dipole dopant source layer that are exposed by the openings in the patterned mask layer. The etching process is a dry etch, a wet etch, other suitable etching process, or a combination thereof. The etching process may selectively remove the second dipole dopant source layer with respect to dipole-engineered high-k dielectric layer 215' and/or the patterned mask layer. In some embodiments, the etching process removes the patterned mask layer, in portion or entirety, from over the dielectric layer. In some embodiments, after the etching process, the patterned mask layer is removed by an etching process and/or a resist stripping process.

A composition and/or a thickness of patterned dipole dopant source layer 230 may be the same or different than a composition and/or a thickness, respectively, of patterned dipole dopant source layer 220. Patterned dipole dopant source layer 230 includes second dipole dopant(s) (e.g., metal) and oxygen, nitrogen, carbon, or a combination thereof (e.g., a non-metal). The second dipole dopant may be the same or different than the first dipole dopant. The second dipole dopant may be driven into dipole-engineered high-k dielectric layer 215' to change a threshold voltage of one or more transistors. For example, driving second dipole dopant into dipole-engineered high-k dielectric layer 215' may increase or decrease a threshold voltage of a transistor depending on transistor type (e.g., n-type or p-type) and dipole type (e.g., n-type or p-type). In some embodiments, patterned dipole dopant source layer 230 is a metal oxide layer, and the second dipole dopant is n-dipole dopant. The n-dipole dopant may be La, Y, Lu, Sr, Er, Mg, other suitable n-dipole dopant, or a combination thereof. In some embodiments, the n-dipole dopant is lanthanum, and patterned dipole dopant source layer 230 is a lanthanum oxide layer (e.g., an $La_2O_3$ layer). In some embodiments, the n-dipole dopant is strontium, and patterned dipole dopant source layer 230 is a strontium oxide layer (e.g., an SrO layer). In some embodiments, the n-dipole dopant is yttrium, and patterned dipole dopant source layer 230 is an yttrium oxide layer (e.g., $Y_2O_3$ layer). In some embodiments, the n-dipole dopant is lutetium, and patterned dipole dopant source layer 230 is a lutetium oxide layer (e.g., an $Lu_2O_3$ layer). In some embodiments, patterned dipole dopant source layer 230 is a metal oxide layer, and the second dipole dopant is p-dipole dopant. The p-dipole dopant may be Al, Ti, Zn, other suitable p-dipole dopant, or a combination thereof. In some embodiments, patterned dipole dopant source layer 230 includes n-dipole dopant and p-dipole dopant. In some embodiments, a metal of patterned dipole dopant source layer 230 (i.e., n-dipole dopant and/or p-dipole dopant) is different than a high-k dielectric metal of high-k dielectric layer 215. Patterned dipole dopant source layer 230 may have a substantially uniform thickness, such as depicted.

Referring to FIG. 3 and FIG. 4F, method 100 at block 180 includes performing a second thermal drive-in process to drive second dipole dopant from the second patterned dipole dopant source layer into gate dielectric 210, thereby providing a dipole-engineered high-k dielectric layer 215". In FIG. 4F, a thermal drive-in process 235 drives (diffuses) n-dipole dopant and/or p-dipole dopant (e.g., metal atoms) from patterned dipole dopant source layer 230 into dipole-engineered high-k dielectric layer 215'. Thermal drive-in process 235 may be an annealing process, such as RTA, MSA, μSA, a microwave annealing, a laser annealing, a spike annealing, a soak annealing, a furnace annealing, other suitable annealing process, or a combination thereof. Parameters of thermal drive-in process 235 (e.g., drive-in temperature, time, ambient, pressure, etc.) are tuned to provide covered portions of dipole-engineered high-k dielectric layer 215' with desired dipole dopant concentrations and/or desired dipole dopant profiles. Thermal drive-in parameters, such as temperature, are selected to sufficiently cause the second dipole dopant to diffuse into dipole-engineered high-k dielectric layer 215' and yet ensure that thermal drive-in process 235 does not adversely affect (e.g., damage) gate dielectric 210, channel structures 212A-212D, other device features, or a combination thereof. In some embodiments, thermal drive-in process 235 and thermal drive-in process 225 implement the same process parameters, such as same drive-in temperature, same duration, etc. In some embodiments, thermal drive-in process 235 and thermal drive-in process 225 implement different process parameters, such as different drive-in temperatures, different durations, etc. Using different process parameters may provide different threshold voltage shifts without using patterned dipole dopant source layers having different thicknesses and/or different compositions. The present disclosure contemplates embodiments where a combination of different thermal drive-in process parameters, different thicknesses of patterned dipole dopant source layers, different compositions of patterned dipole dopant source layers, or a combination thereof are implemented to achieve desired threshold voltage differences between transistors.

Because thermal drive-in process 235 diffuses dipole dopant into covered portions of dipole-engineered high-k dielectric layer 215' (i.e., portions having patterned dipole dopant source layer 230 thereon) but not into uncovered, exposed portions of dipole-engineered high-k dielectric layer 215', compositions of covered portions of dipole-engineered high-k dielectric layer 215' change, while compositions of exposed portions of dipole-engineered high-k dielectric layer 215' do not (or negligibly) change. For example, high-k dielectric layer 215 of transistor 20L-1 and high-k dielectric layer 215D of transistor 20L-3 include second dipole dopant, while high-k dielectric layer 215 of transistor 20L-2 and high-k dielectric layer 215D of transistor 20L-4 do not include second dipole dopant. Accordingly, high-k dielectric layer 215 of transistor 20L-1 becomes a high-k dielectric layer 215A, high-k dielectric layer 215D of transistor 20L-3 becomes a high-k dielectric layer 215C, and high-k dielectric 215 of transistor 20L-2 (into which neither the first dipole dopant or the second dipole dopant is introduced) may be designated as a high-k dielectric 215B. In some embodiments, high-k dielectric layer 215A includes the high-k dielectric metal (e.g., hafnium and/or zirconium), oxygen, and second dipole metal; high-k dielectric layer 215B includes the high-k dielectric metal (e.g., hafnium and/or zirconium) and oxygen; high-k dielectric layer 215C includes the high-k dielectric metal, oxygen, first dipole metal, and second dipole metal; and high-k dielectric layer 215D includes the high-k dielectric metal, oxygen, and first dipole metal. In some embodiments, thermal drive-in process 235 diffuses the second dipole dopant from patterned dipole dopant source layer 230 to an interface between interfacial layer 214 and covered portions of dipole-engineered high-k dielectric layer 215' and/or into portions of interfacial layer 214 covered by patterned dipole dopant source layer 230. In such embodiments, compositions of interfacial layers 214 of transistor 20L-1 and transistor 20L-3 may be different than compositions of interfacial layers 214 of transistor 20L-2 and transistor 20L-4. For example, interfacial layers 214 of transistor 20L-1 and transistor 20L-3 include second dipole metal, while interfacial layers 214 of transistor 20L-2 and transistor 20L-4 do not include second dipole metal (e.g., from patterned dipole dopant source layer 230).

In embodiments where the first dipole metal and the second dipole metal are the same, a concentration of dipole metal in high-k dielectric layer 215C is greater than a concentration of dipole metal in high-k dielectric layer 215D and a concentration of dipole metal in high-k dielectric layer 215A. In such embodiments, the concentration of dipole metal in high-k dielectric layer 215A may be different than the concentration of dipole metal in high-k dielectric layer 215D, and such dipole metal concentration differences may be obtained by providing patterned dipole dopant source layer 230 and patterned dipole dopant source layer 230 with different thickness and/or implementing different temperatures in thermal drive-in process 225 and thermal drive-in process 235. For example, where a thickness of patterned dipole dopant source layer 230 is greater than a thickness of patterned dipole dopant source layer 220, the concentration of dipole metal in high-k dielectric layer 215A may be greater than the concentration of dipole metal in high-k dielectric layer 215D. In other words, since more dipole dopant (i.e., metal atoms) may diffuse into a gate dielectric from a thicker patterned dipole dopant source layer, the thicker patterned dipole dopant source layer may provide greater threshold voltage shifts. In another example, where a thermal drive-in temperature of thermal drive-in process 235 is greater than a thermal drive-in temperature of thermal drive-in process 225, the concentration of dipole metal in high-k dielectric layer 215A may be greater than the concentration of dipole metal in high-k dielectric layer 215D. In other words, since higher thermal drive-in temperatures may cause more dipole dopant (i.e., metal atoms) to diffuse into a gate dielectric from a patterned dipole dopant source layer, the higher thermal drive-in temperatures may provide more dipole dopant and greater threshold voltage shifts.

Referring to FIG. 3 and FIG. 4G, method 100 at block 185 includes removing second patterned dipole dopant source layer 230. In some embodiments, an etching process selectively removes patterned dipole dopant source layer 230 with respect to dipole-engineered high-k dielectric layer 215". For example, the etching process etches patterned dipole dopant source layer 230 with no (or negligible) etching of high-k dielectric layers 215A-215D. An etchant of the etching process may etch patterned dipole dopant source layer 230 (e.g., metal oxide having a fourth composition) at a higher rate than high-k dielectric layers 215A-215D (e.g., metal oxides having a fifth composition, the second composition, a sixth composition, and the third composition, respectively, each of which is different than the fourth composition). The etching process is a dry etch, a wet etch, other suitable etch, or a combination thereof.

Referring to FIG. 3 and FIG. 4H, method 100 at block 190 includes forming a gate electrode 240 over gate dielectric 210 (e.g., high-k dielectric layers 215A-215D thereof). Gate electrode 240 includes at least one electrically conductive gate layer. Gate electrode 240 is (and/or electrically conductive gate layers thereof are) formed by ALD, CVD, PVD, plating, other suitable process, or a combination thereof. In some embodiments, a planarization process (e.g., CMP) removes excess gate electrode 240, such as that disposed over ILD layer 72L and/or CESL 72L. In Y-Z cross-sectional views, gate electrode 240 may surround semiconductor layers 26L and wrap mesas 14' of lower transistors 20L, and gate electrode 240 may extend over tops of substrate isolation structures 30. In X-Z cross-sectional views, gate electrode 240 may cover tops and bottoms of semiconductor layers 26L and tops of mesas 14' of lower transistors 20L. In some embodiments, in X-Z cross-sectional views, portions of gate electrode 240 over tops of semiconductor layers 26L of lower transistors 20L may have u-shaped profiles. In embodiments where gate electrode 240 is formed during a gate replacement process, gate electrode 240 fills a remainder of the gate openings that expose channel structures 212A-212D, gate electrode 240 fills a remainder of gaps between semiconductor layers 26L, and gate electrode 240 fills a remainder of gaps between bottom semiconductor layers 26L and mesas 14'.

In the depicted embodiment, gate electrode 240 is and/or includes a work function layer. The work function layer may be an n-type work function metal (N-WFM) layer, a p-type work function metal (P-WFM) layer, or a combination thereof. An N-WFM layer (also referred to as an n-metal layer) includes an n-type work function material, which generally refers to an electrically conductive material tuned to have an n-type work function, and a p-WFM layer (also referred to as a p-metal layer) includes a p-type work function material, which generally refers to an electrically conductive material tuned to have a p-type work function. The n-type work function material may include a metal with a sufficiently low effective work function, such as aluminum, titanium, tantalum, zirconium, other n-metal, alloys thereof, or a combination thereof. In some embodiments, the N-WFM layer is a titanium aluminum layer, a titanium aluminum carbide layer, a tantalum carbide layer, a tantalum carbide nitride layer, or a tantalum silicon nitride. The p-type work function material may include a metal with a sufficiently high effective work function, such as titanium, tantalum, ruthenium, molybdenum, tungsten, platinum, other p-metal, alloys thereof, or a combination thereof. In some embodiments, the P-WFM layer is a titanium nitride layer, a titanium carbide layer, a titanium silicon nitride layer, a tantalum nitride layer, a tungsten carbonitride layer, or a molybdenum layer. In some embodiments, the work function layer has a multilayer structure, such as more than one N-WFM layer.

In some embodiments, gate electrode 240 further includes metal fill layers and/or additional gate electrode layers over the work function layer. The metal fill/bulk layers may include aluminum, tungsten, cobalt, copper, other suitable electrically conductive material, alloys thereof, or a combination thereof. The additional layers may include caps (e.g., a metal nitride cap and/or a silicon cap) and/or barrier layers (e.g., a metal nitride barrier). In some embodiments, during a gate replacement process, the work function layer partially fills the gate openings that expose channel structures 212A-212D, and metal fill layers and/or additional gate electrode layers are formed over the work function layer to fill remainders of the gate openings. In such embodiments, the work function layer may partially fill or fill remainders of gaps between semiconductor layers 26L and/or gaps between semiconductor layers 26L and mesas 14'. In embodiments where the work function layer partially fill the gaps, the metal fill layers and/or additional gate electrode layers may fill remainders of the gaps.

Method 150 thus provides lower transistors 20L of stacked device structure 10 with different gate dielectrics (i.e., gate dielectrics having different compositions and/or different configurations), but the same gate electrodes (i.e., gate electrodes having the same configuration and/or the same composition). Providing lower transistors 20L with different gate dielectrics adjusts their threshold voltages relative to one another, such that transistor 20L-1 has a first threshold voltage (Vt1), transistor 20L-2 has a second threshold voltage (Vt2), transistor 20L-3 has a third threshold voltage (Vt3), transistor 20L-4 has a fourth threshold voltage (Vt4), and the first threshold voltage, the second threshold voltage, the third threshold voltage, and the fourth threshold voltage are different. In the depicted embodiment, gate dielectric 78L-1 of transistor 20L-1 includes high-k dielectric layer 215A (doped with second dipole metal) and a respective interfacial layer 214 (which may be doped with second dipole metal), gate dielectric 78L-2 of transistor 20L-2 includes high-k dielectric layer 215B (not doped with first dipole metal or second dipole metal (i.e., undoped)) and a respective interfacial layer 214, gate dielectric 78L-3 of transistor 20L-3 includes high-k dielectric layer 215C (doped with first dipole metal and second dipole metal) and a respective interfacial layer 214 (which may be doped with first dipole metal and second dipole metal), and gate dielectric 78L-4 of transistor 20L-4 includes high-k dielectric layer 215D (doped with first dipole metal) and a respective interfacial layer 214 (which may be doped with first dipole metal). Further, gate electrode 80L-1 of transistor 20L-1, gate electrode 80L-2 of transistor 20L-2, gate electrode 80L-3 of transistor 20L-3, and gate electrode 80L-4 of transistor 20L-4 each include gate electrode 240. In some embodiments, gate electrode 240 is and/or includes an N-WFM layer (i.e., lower transistors 20L have the same n-metal layer). In some embodiments, gate electrode 240 is and/or includes a P-WFM layer (i.e., lower transistors 20L have the same p-metal layer). In some embodiments, gate electrode 240 includes the work function layer and additional gate electrode layers, such as a metal/fill bulk layer.

Figure 5:
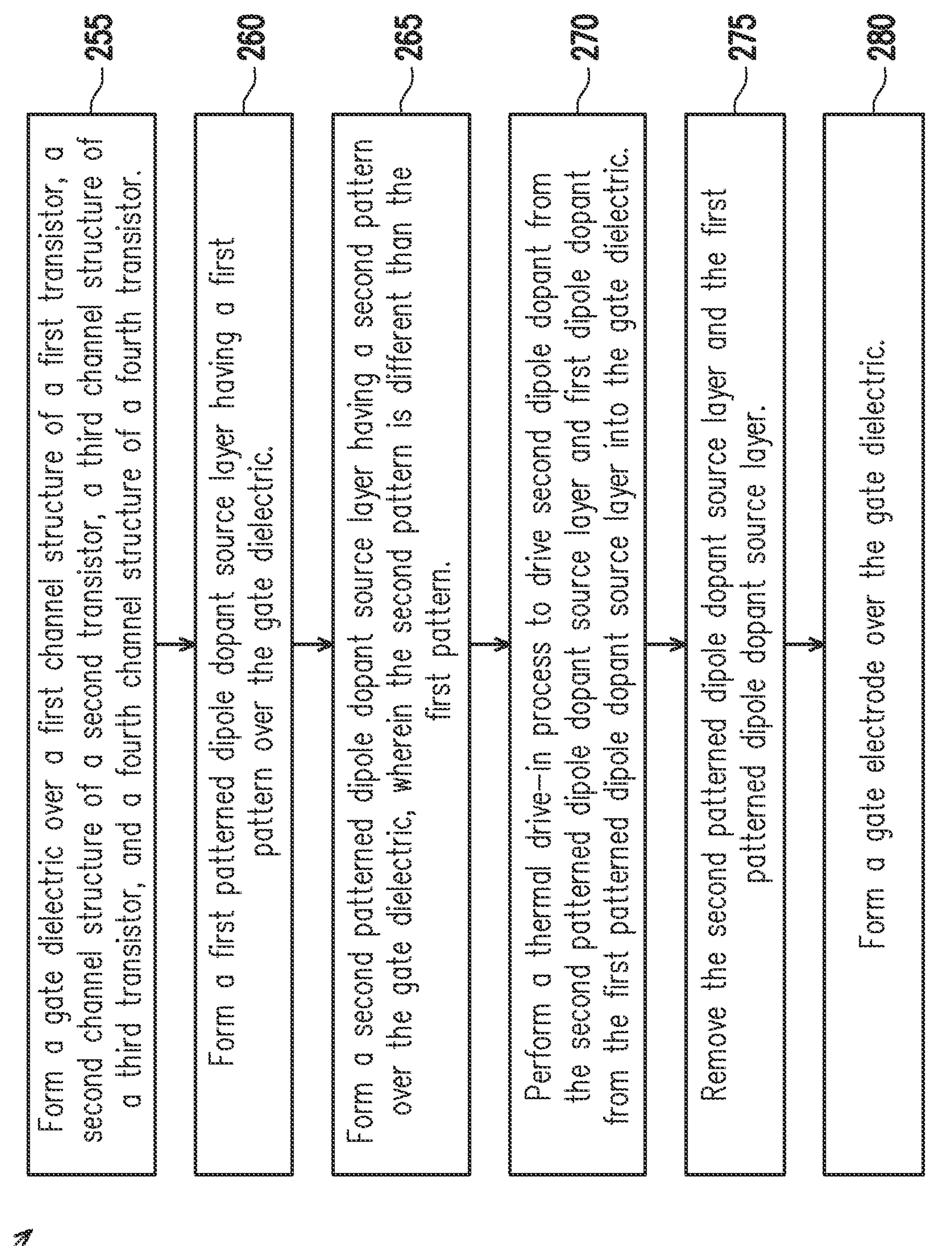
FIG. 5 is a flow chart of another method for fabricating gate stacks of four transistors of a given level of a stacked transistor structure, such as stacked device structure of FIG. 1A, according to various aspects of the present disclosure.

FIG. 5 is a flow chart of a method 250 for fabricating gate stacks of four transistors of a given level of a stacked transistor structure, such as gate stacks of lower transistors 20L of a lower (or bottom) level of stacked device structure 10, according to various aspects of the present disclosure. FIGS. 6A-6F are schematic views of a given level of a stacked transistor structure, such as the lower level of stacked device structure 10 (i.e., lower transistors 20L of device 12L), in portion or entirety, at various fabrication stages associated with method 250 of FIG. 5, according to various aspects of the present disclosure. Method 250 provides a specific implementation of method 100. For example, method 250 implements two patterned dipole dopant source layers (i.e., N=2) to provide the four transistors with four different threshold voltages ($2^N=2^2=4$). Method 150 is similar in many respects to method 100, except method 150 implements a thermal drive-in process for two patterned dipole dopant source layers, instead of a thermal drive-in process for each patterned dipole dopant source layer. Accordingly, similar features in FIGS. 6A-6F and FIGS. 4A-4H are identified by the same reference numerals for clarity and simplicity. FIG. 5 and FIGS. 6A-6F are discussed concurrently herein for case of description and understanding. FIG. 5 and FIGS. 6A-6F have been simplified for the sake of clarity to better understand the inventive concepts of the present disclosure. For example, some features are consolidated into and represented by a single feature in FIGS. 6A-6F (e.g., channel layers of a given transistor are consolidated into and represented by a channel structure), and some features are omitted in FIGS. 6A-6F. Additional steps may be provided before, during, and after method 250, and some of the steps described may be moved, replaced, or eliminated for additional embodiments of method 250. Additional features may be added in the stacked device structure of FIGS. 6A-6F, and some of the features described below may be replaced, modified, or eliminated in other embodiments of the stacked device structure of FIGS. 6A-6F.

Figures 6A, 6B, 6C, 6D:
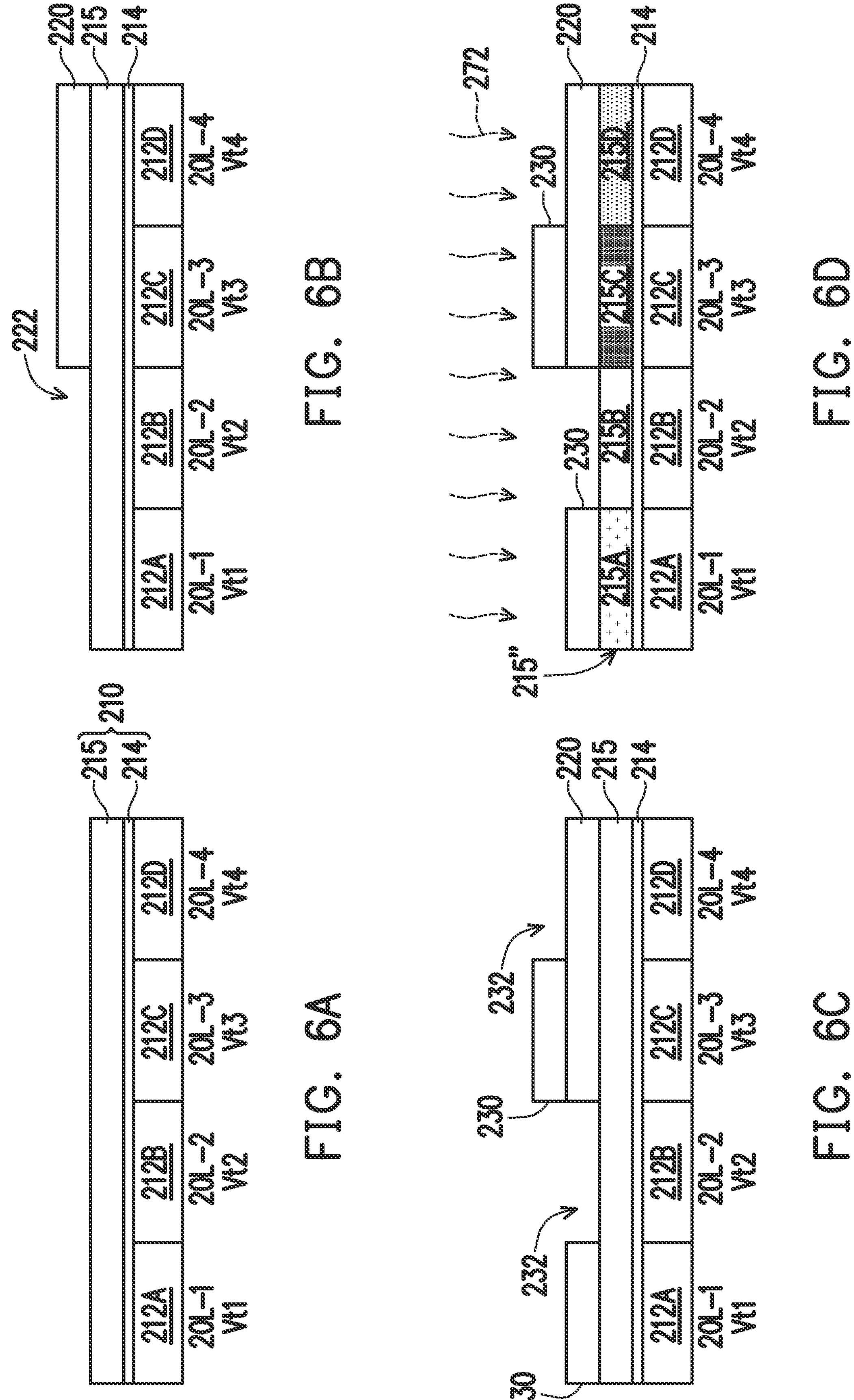
FIGS. 6A-6F are schematic views of a given level of a stacked transistor structure, such as a lower level of stacked device structure of FIG. 1A, at various fabrication stages of the method of FIG. 5, according to various aspects of the present disclosure.

Referring to FIG. 5 and FIG. 6A, method 250 at block 255 includes forming a gate over a first channel structure of a first transistor (e.g., transistor 20L-1), a second channel structure of a second transistor (e.g., transistor 20L-2), a third channel structure of a third transistor (e.g., transistor 20L-3), and a fourth channel structure of a fourth transistor (e.g., transistor 20L-4). For example, gate dielectric 210 is formed over channel structures 212A-212D, and gate dielectric 210 includes interfacial layer 214 and high-k dielectric layer 215 (e.g., an $HfO_2$ or $ZrO_2$ layer), such as described above with reference to FIG. 3 and FIG. 4A.

Referring to FIG. 5 and FIG. 6B, method 250 at block 260 includes forming a first patterned dipole dopant source layer having a first pattern over the gate dielectric. For example, patterned dipole dopant source layer 220 is formed over high-k dielectric layer 215, such as described above with reference to FIG. 3 and FIG. 4B. Patterned dipole dopant source layer 220 has opening(s) 222 therein, such that patterned dipole dopant source layer 220 covers high-k dielectric layer 215 of some transistors (e.g., transistor 20L-3 and transistor 20L-4) and exposes high-k dielectric layer 215 of other transistors (e.g., transistor 20L-1 and transistor 20L-2).

Referring to FIG. 5 and FIG. 6C, method 250 at block 265 includes forming a second patterned dipole dopant source layer over the first patterned dipole dopant source layer. The second patterned dipole dopant source layer has a second pattern that is different than the first pattern of the first patterned dipole dopant source layer. For example, patterned dipole dopant source layer 230 is formed over patterned dipole dopant source layer 220 and high-k dielectric layer 215, such as described above with reference to FIG. 3 and FIG. 4E. Patterned dipole dopant source layer 230 has opening(s) 232 therein, such that patterned dipole dopant source layer 230 covers high-k dielectric layer 215 of some transistors (e.g., transistor 20L-1 and transistor 20L-3), exposes high-k dielectric layer 215 of some transistors (e.g., transistor 20L-2), and exposes patterned dipole dopant source layer 220 of some transistors (e.g., transistor 20L-4). The group of transistors covered/exposed by patterned dipole dopant source layer 230 is different than the group of transistors covered/exposed by patterned dipole dopant source layer 220. For example, patterned dipole dopant source layer 230 covers transistor 20L-1 and transistor 20L-3, while patterned dipole dopant source layer 220 covers transistor 20L-3 and transistor 20L-4. Further, patterned dipole dopant source layer 230 exposes transistor 20L-2 and transistor 20L-4, while patterned dipole dopant source layer 220 exposes transistor 20L-1 and transistor 20L-2.

Referring to FIG. 5 and FIG. 6D, method 250 at block 270 includes performing a thermal drive-in process to drive second dipole dopant from the second patterned dipole dopant source layer and first dipole dopant from the first patterned dipole dopant source layer into gate dielectric 210, thereby providing dipole-engineered high-k dielectric layer 215". For example, a thermal drive-in process 272 drives dipole dopant from patterned dipole dopant source layer 230 and patterned dipole dopant source layer 220 into high-k dielectric layer 215. Thermal drive-in process 272 may be an annealing process, such as RTA, MSA, USA, a microwave annealing, a laser annealing, a spike annealing, a soak annealing, a furnace annealing, other suitable annealing process, or a combination thereof. Parameters of thermal drive-in process 272 (e.g., drive-in temperature, time, ambient, pressure, etc.) are tuned to provide covered portions of high-k dielectric layer 215 with desired dipole dopant concentrations and/or desired dipole dopant profiles. Thermal drive-in parameters, such as temperature, are selected to sufficiently cause the second dipole dopant and the first dipole dopant to diffuse into high-k dielectric layer 215 and yet ensure that thermal drive-in process 272 does not adversely affect gate dielectric 210, channel structures 212A-212D, other device features, or a combination thereof.

Because thermal drive-in process 272 diffuses dipole dopant into covered portions of high-k dielectric layer 215 (i.e., portions having patterned dipole dopant source layer 230 and/or patterned dipole dopant source layer 220 thereon) but not into uncovered, exposed portions of high-k dielectric layer 215, compositions of covered portions of high-k dielectric layer 215 change, while compositions of exposed portions of high-k dielectric layer 215 do not (or negligibly) change. Further, since high-k dielectric layer 215 of transistor 20L-1 has only patterned dipole dopant source layer 230 thereon, high-k dielectric layer 215 of transistor 20L-3 has both patterned dipole dopant source layer 230 and patterned dipole dopant source layer 220 thereon, and high-k dielectric layer 215 of transistor 20L-4 has only patterned dipole dopant source layer 220 thereon, compositions of high-k dielectric layer 215 of transistor 20L-1, transistor 20L-3, and transistor 20L-4 are different. For example, high-k dielectric layer 215 of transistor 20L-1 becomes high-k dielectric layer 215A, high-k dielectric 215 of transistor 20L-2 (into which neither the first dipole dopant or the second dipole dopant is introduced) may be designated as a high-k dielectric 215B, high-k dielectric layer 215 of transistor 20L-3 becomes high-k dielectric layer 215C, and high-k dielectric layer 215 of transistor 20L-3 becomes high-k dielectric layer 215D. In some embodiments, high-k dielectric layer 215A includes the high-k dielectric metal, oxygen, and second dipole metal; high-k dielectric layer 215B includes the high-k dielectric metal and oxygen; high-k dielectric layer 215C includes the high-k dielectric metal, oxygen, first dipole metal, and second dipole metal; and high-k dielectric layer 215D includes the high-k dielectric metal, oxygen, and first dipole metal. In some embodiments, thermal drive-in process 272 diffuses the second dipole dopant from patterned dipole dopant source layer 230 and/or patterned dipole dopant source layer 220 to an interface between interfacial layer 214 and covered portions of high-k dielectric layer 215 and/or into portions of interfacial layer 214 covered by patterned dipole dopant source layer 230 and/or patterned dipole dopant source layer 230. In such embodiments, interfacial layer 214 of transistor 20L-1 may include silicon, oxygen, and second dipole metal (but not first dipole metal); interfacial layer 214 of transistor 20L-2 may include silicon and oxygen (i.e., not doped with first dipole metal or second dipole metal); interfacial layer 214 of transistor 20L-3 may include silicon, oxygen, first dipole metal, and second dipole metal; and interfacial layer 214 of transistor 20L-4 may include silicon, oxygen, and first dipole metal (but not second dipole metal).

Figures 6E, 6F:
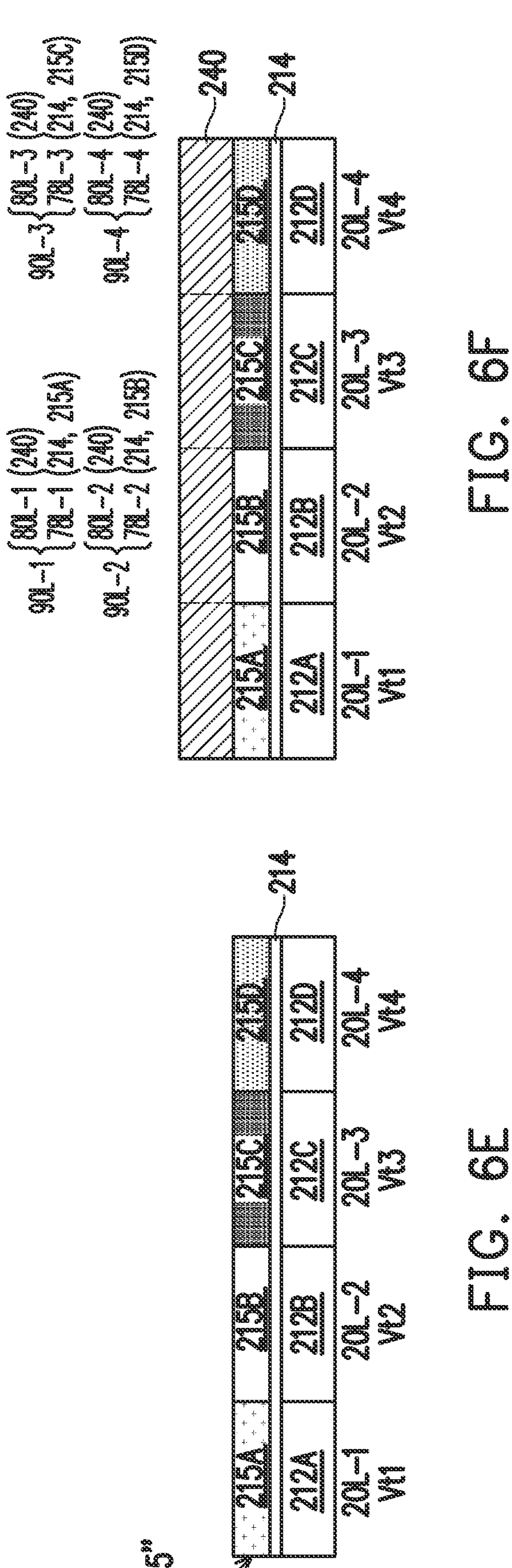

Referring to FIG. 5 and FIG. 6E, method 250 at block 275 includes removing the second patterned dipole dopant source layer and the first patterned dipole dopant source layer. For example, patterned dipole dopant source layer 230 and patterned dipole dopant source layer 220 are removed from over dipole-engineered high-k dielectric layer 215". In some embodiments, an etching process selectively removes patterned dipole dopant source layer 230 and patterned dipole dopant source layer 220 with respect to dipole-engineered high-k dielectric layer 215". For example, the etching process etches patterned dipole dopant source layer 230 and patterned dipole dopant source layer 220 with no (or negligible) etching of high-k dielectric layers 215A-215D. An etchant of the etching process may etch patterned dipole dopant source layer 230 and patterned dipole dopant source layer 220 (e.g., metal oxides having the first composition and the fourth composition) at a higher rate than high-k dielectric layers 215A-215D (e.g., metal oxides having the fifth composition, the second composition, the sixth composition, and the third composition, respectively). The etching process is a dry etch, a wet etch, other suitable etch, or a combination thereof. In some embodiments, patterned dipole dopant source layer 230 and patterned dipole dopant source layer 220 are removed in a multistep process, such as a first etching process that selectively removes patterned dipole dopant source layer 230 with no (or negligible) etching of high-k dielectric layers 215A-215D and a second etching process that selectively removes patterned dipole dopant source layer 220 with no (or negligible) etching of high-k dielectric layers 215A-215D. In some embodiments, the first etching process may partially remove patterned dipole dopant source layer 220, or the first etching process may not (or negligibly) remove patterned dipole dopant source layer 220.

Referring to FIG. 5 and FIG. 6F, method 280 at block 280 includes forming a first gate electrode over the gate dielectric. For example, gate electrode 240 is formed over high-k dielectric layers 215A-215D, such as described above with reference to FIG. 3 and FIG. 4H. Method 250 thus implements less thermal drive-in processes than method 150 to provide lower transistors 20L of stacked device structure 10 with different gate dielectrics (i.e., gate dielectrics having different compositions and/or different configurations), but the same gate electrodes (i.e., gate electrodes having the same configuration and/or the same composition), thereby providing lower transistors 20L with different threshold voltages, such as described above.

FIGS. 8A-8F are schematic views of a given level of a stacked transistor structure, such as the lower level of stacked device structure 10, in portion or entirety, at various stages of a dipole engineering process, according to various aspects of the present disclosure. The depicted dipole engineering process implements method 100. For example, the dipole engineering process implements three patterned dipole dopant source layers (i.e., N=3) to provide eight different threshold voltages ($2^N=2^3=8$). In the depicted embodiment, the dipole engineering process provides the different threshold voltages for eight transistors, such as a transistor 305A, a transistor 305B, a transistor 305C, a transistor 305D, a transistor 305E, a transistor 305F, a transistor 305G, and a transistor 305H. Each of the patterned dipole dopant source layers covers/exposes a different combination of transistors 305A-305H, such that different amounts of dipole dopant and/or different dipole dopants are introduced into gate dielectrics thereof to adjust their threshold voltages differently. FIGS. 8A-8F have been simplified for the sake of clarity to better understand the inventive concepts of the present disclosure. For example, some features are consolidated into and represented by a single feature in FIGS. 8A-8F (e.g., channel layers of a given transistor are consolidated into and represented by a channel structure), and some features are omitted in FIGS. 8A-8F. Additional features may be added in the stacked device structure of FIGS. 8A-8F, and some of the features described below may be replaced, modified, or eliminated in other embodiments of the stacked device structure of FIGS. 8A-8F.

Figures 7A, 7B:
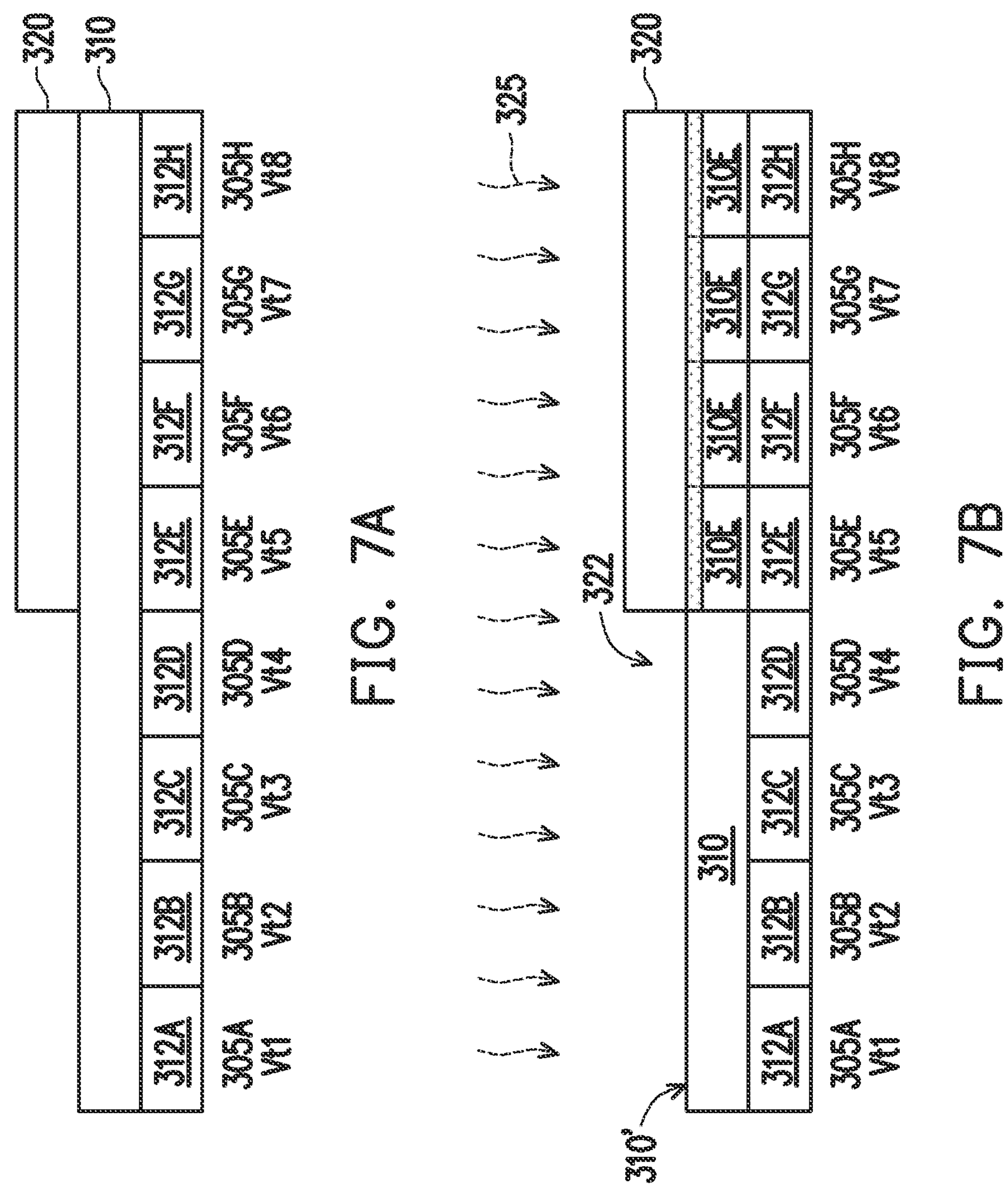
FIGS. 7A-7G are schematic views of a given level of a stacked transistor structure, such as a lower level of stacked device structure of FIG. 1A, at various fabrication stages of a dipole engineering process, according to various aspects of the present disclosure.

Referring to FIG. 7A, the dipole engineering process includes forming a gate dielectric 310 over channel structures 312A-312H of transistors 305A-305H, respectively, and forming a first patterned dipole dopant source layer 320 (N=1) having a first pattern over gate dielectric 310. Gate dielectric 310 is similar to gate dielectric 210 described above, and patterned dipole dopant source layer 320 is similar to patterned dipole dopant source layer 220 and/or patterned dipole dopant source layer 230 described above. Patterned dipole dopant source layer 320 has opening(s) 322 therein, such that patterned dipole dopant source layer 320 covers some transistors (e.g., transistors 305E-305H) and exposes other transistors (e.g., transistors 305A-305D). Patterned dipole dopant source layer 320 has a first composition, and patterned dipole dopant source layer 320 includes a first dipole dopant (e.g., n-dipole dopant). In some embodiments, patterned dipole dopant source layer 320 is a first patterned metal oxide layer, and the first patterned metal oxide layer includes n-dipole dopant (e.g., La, Y, Sr, Lu, etc.).

Figures 7C, 7D:
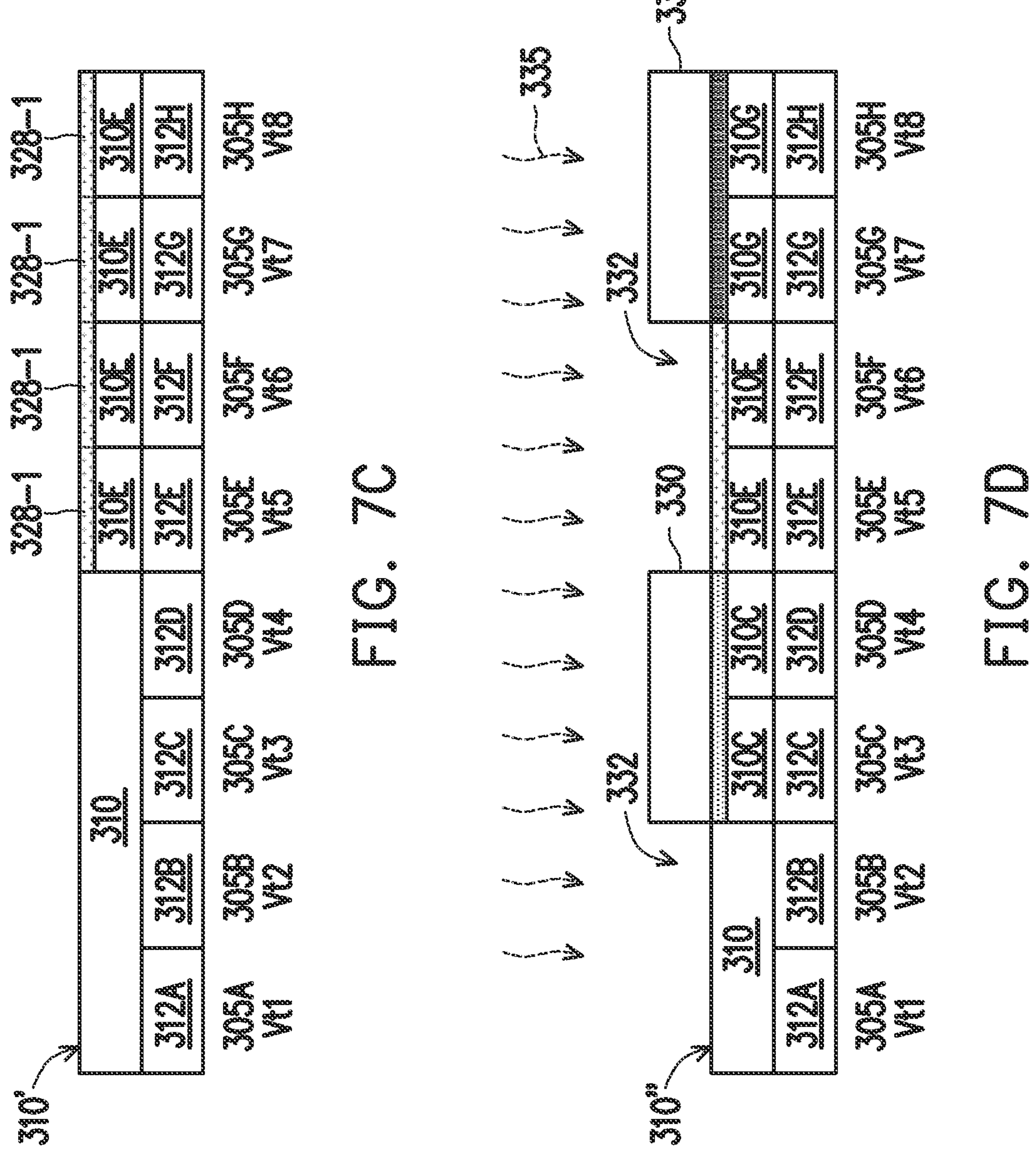

Referring to FIG. 7B and FIG. 7C, the dipole engineering process includes performing a thermal drive-in process 325 to drive first dipole dopant from patterned dipole dopant source layer 320 into covered portions of gate dielectric 310 (FIG. 7B) (and thereby providing a dipole-engineered gate dielectric 310') and removing patterned dipole dopant source layer 320 (FIG. 7C). Thermal drive-in process 325 may be similar to thermal drive-in process 225, thermal drive-in process 235, thermal drive-in process 272, or a combination thereof described above. Because thermal drive-in process 325 diffuses first dipole dopant into covered portions of gate dielectric 310 (i.e., portions having patterned dipole dopant source layer 320 thereon) but not into uncovered, exposed portions of gate dielectric 310, compositions of covered portions of gate dielectric 310 change, while compositions of exposed portions of gate dielectric 310 do not (or negligibly) change. For example, gate dielectric 310 of transistors 305E-305H become gate dielectrics 310E, which may include a high-k dielectric metal, oxygen, and first dipole metal, while gate dielectric 310 may include the high-k dielectric metal and oxygen. Since the first dipole dopant may not diffuse uniformly and/or entirely through covered portions of gate dielectric 310, gate dielectrics 310E may have diffusion regions 328-1 therein (e.g., along tops thereof) that may include the high-k dielectric metal, oxygen, and first dipole metal, while other portions of gate dielectrics 310E (e.g., bottoms thereof) include the high-k metal and oxygen, but not first dipole metal. Transistors 305A-305H thus have one of two threshold voltages after a first dipole engineering loop, such as a threshold voltage provided by gate dielectrics 310 or a threshold voltage provided by gate dielectrics 310E.

Figures 7E, 7F:
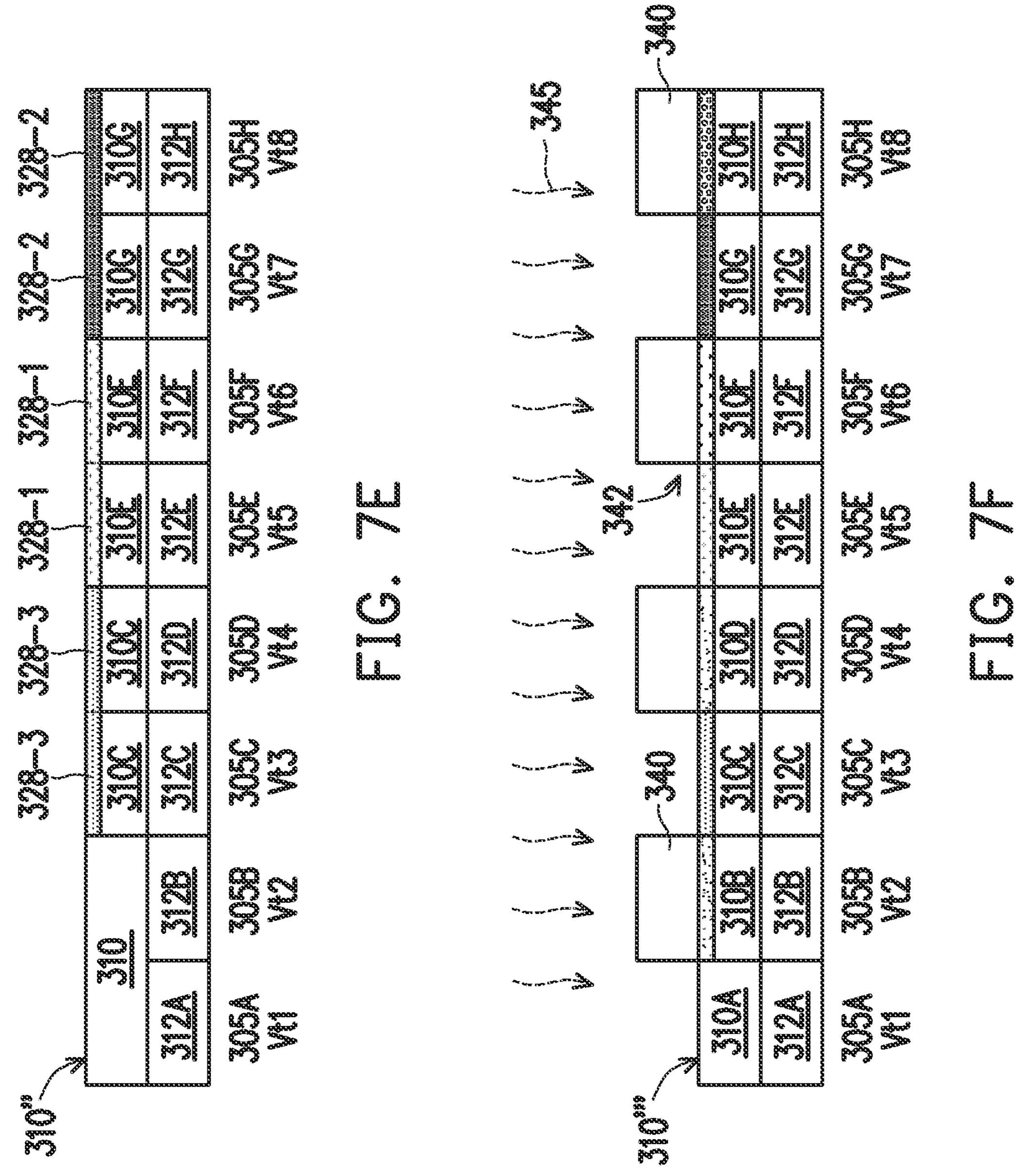

Referring to FIG. 7D and FIG. 7E, the dipole engineering process includes forming a second patterned dipole dopant source layer 330 (N=2) having a second pattern over dipole-engineered gate dielectric 310' (FIG. 7D), performing a thermal drive-in process 335 to drive second dipole dopant from patterned dipole dopant source layer 330 into covered portions of dipole-engineered gate dielectric 310' (FIG. 7D) (and thereby providing a dipole-engineered gate dielectric 310"), and removing patterned dipole dopant source layer 330 (FIG. 7E). Patterned dipole dopant source layer 330 is similar to patterned dipole dopant source layer 220, patterned dipole dopant source layer 230, patterned dipole dopant source layer 320, or a combination thereof described above. Patterned dipole dopant source layer 330 has opening(s) 332 therein, such that patterned dipole dopant source layer 330 covers some transistors (e.g., transistor 305C, transistor 305D, transistor 305G, and transistor 305H) and exposes other transistors (e.g., transistor 305A, transistor 305B, transistor 305E, and transistor 305F). A group of transistors covered/exposed by patterned dipole dopant source layer 330 is different than a group of transistors covered/exposed by patterned dipole dopant source layer 320. For example, patterned dipole dopant source layer 330 covers transistor 305C, transistor 305D, transistor 305G, and transistor 305H, while patterned dipole dopant source layer 320 covers transistors 350E-350H; and patterned dipole dopant source layer 330 exposes transistor 305A, transistor 305B, transistor 305E, and transistor 305F, while patterned dipole dopant source layer 320 exposes transistors 350A-350D. It is noted that patterned dipole dopant source layer 330 and patterned dipole dopant source layer 320 cover/expose some of the same transistors (e.g., both cover transistor 305G and transistor 305H and expose transistor 305A and transistor 305B).

Patterned dipole dopant source layer 330 has a second composition, and patterned dipole dopant source layer 330 includes a second dipole dopant (e.g., n-dipole dopant). In some embodiments, patterned dipole dopant source layer 330 is a second patterned metal oxide layer, and the second patterned metal oxide layer may include n-dipole dopant (e.g., La, Y, Sr, Lu, etc.). The second composition may be the same or different than the first composition. In some embodiments, the second dipole dopant is different than the first dipole dopant. For example, the second dipole dopant and the first dipole dopant are different n-dipole metals or different p-dipole metals. In another example, the second dipole dopant is a p-dipole metal, and the first dipole dopant is an n-dipole metal, or vice versa. In some embodiments, the second dipole dopant is the same as the first dipole dopant. In some embodiments, an atomic percentage of the second dipole dopant is different than an atomic percentage of the first dipole dopant. In some embodiments, an atomic percentage of the second dipole dopant is the same as an atomic percentage of the first dipole dopant. In some embodiments, a thickness of patterned dipole dopant source layer 330 is different than a thickness of patterned dipole dopant source layer 320. In such embodiments, the second dipole dopant may be the same as the first dipole dopant.

Thermal drive-in process 335 may be similar to thermal drive-in process 225, thermal drive-in process 235, thermal drive-in process 272, thermal drive-in process 325, or a combination thereof described above. Because thermal drive-in process 335 diffuses second dipole dopant into covered portions of dipole-engineered gate dielectric 310' (i.e., portions having patterned dipole dopant source layer 330 thereon) but not into uncovered, exposed portions of dipole-engineered gate dielectric 310', compositions of covered portions of dipole-engineered gate dielectric 310' change, while compositions of exposed portions of dipole-engineered gate dielectric 310' do not (or negligibly) change. For example, gate dielectric 310 of transistor 305C and transistor 305D become gate dielectrics 310C (which may include the high-k dielectric metal, oxygen, and second dipole metal) and gate dielectrics 310E of transistor 305G and transistor 305H become gate dielectrics 310G (which may include the high-k dielectric metal, oxygen, first dipole metal, and second dipole metal), while compositions of gate dielectric 310 of transistor 305A and transistor 305B and gate dielectrics 310E of transistor 305E and transistor 305F do not (or negligibly) change. Since the second dipole dopant may not diffuse uniformly and/or entirely through covered portions of dipole-engineered gate dielectric 310' and second dipole dopant is diffused into some portions, but not other portions, of dipole-engineered gate dielectric 310', gate dielectrics 310E may have diffusion regions 328-1 therein; gate dielectrics 310G may have diffusion regions 328-2 therein (e.g., along tops thereof) that may include the high-k dielectric metal, oxygen, first dipole metal, and second dipole metal, while other portions of gate dielectrics 310G (e.g., bottoms thereof) include the high-k metal and oxygen, but not first dipole metal and/or second dipole metal; and gate dielectrics 310C may have diffusion regions 328-3 therein (e.g., along tops thereof) that may include the high-k dielectric metal, oxygen, and second dipole metal, while other portions of gate dielectrics 310C (e.g., bottoms thereof) include the high-k metal and oxygen, but not second dipole metal. Transistors 305A-305H thus have one of four threshold voltages after a second dipole engineering loop, such as a threshold voltage provided by gate dielectrics 310, a threshold voltage provided by gate dielectrics 310C, a threshold voltage provided by gate dielectrics 310E, or a threshold voltage provided by gate dielectrics 310G.

Figure 7G:
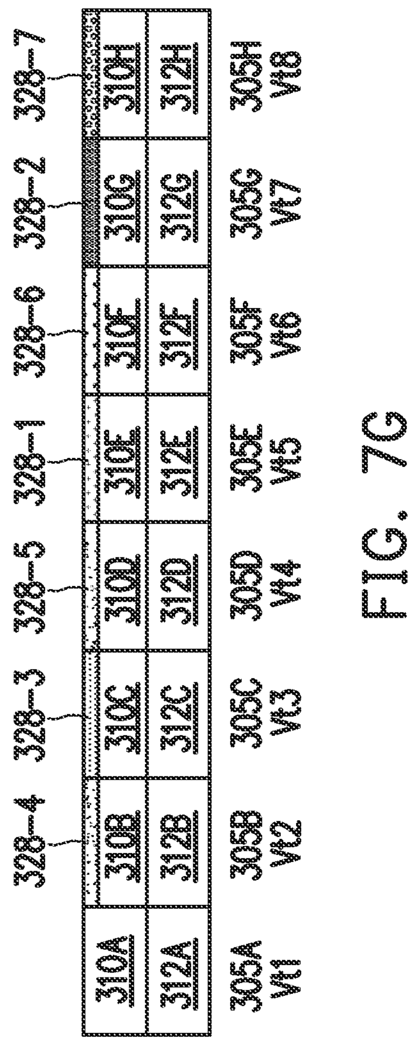

Referring to FIG. 7F and FIG. 7G, the dipole engineering process includes forming a third patterned dipole dopant source layer 340 (N=3) having a third pattern over dipole-engineered gate dielectric 310" (FIG. 7F), performing a thermal drive-in process 345 to drive third dipole dopant from patterned dipole dopant source layer 340 into covered portions of dipole-engineered gate dielectric 310" (FIG. 7F) (and thereby providing a dipole-engineered gate dielectric 310""), and removing patterned dipole dopant source layer 340 (FIG. 7G). Patterned dipole dopant source layer 340 is similar to patterned dipole dopant source layer 220, patterned dipole dopant source layer 230, patterned dipole dopant source layer 320, patterned dipole dopant source layer 330, or a combination thereof described above. Patterned dipole dopant source layer 340 has opening(s) 342 therein, such that patterned dipole dopant source layer 340 covers some transistors (e.g., transistor 305B, transistor 305D, transistor 305F, and transistor 305H) and exposes other transistors (e.g., transistor 305A, transistor 305C, transistor 305E, and transistor 305G). A group of transistors covered/exposed by patterned dipole dopant source layer 340 is different than a group of transistors covered/exposed by patterned dipole dopant source layer 330 and patterned dipole dopant source layer 320. For example, patterned dipole dopant source layer 340 covers transistor 305B, transistor 305D, transistor 305F, and transistor 305H, while patterned dipole dopant source layer 330 covers transistor 305C, transistor 305D, transistor 305G, and transistor 305H; and patterned dipole dopant source layer 340 exposes transistor 305A, transistor 305C, transistor 305E, and transistor 305G, while patterned dipole dopant source layer 320 exposes transistor 305A, transistor 305B, transistor 305E, and transistor 305F. It is noted that patterned dipole dopant source layer 340 and patterned dipole dopant source layer 330 cover/expose some of the same transistors (e.g., both cover transistor 305D and transistor 305H and expose transistor 305A and transistor 305E).

Patterned dipole dopant source layer 340 has a third composition, and patterned dipole dopant source layer 340 includes a third dipole dopant (e.g., n-dipole dopant). In some embodiments, patterned dipole dopant source layer 340 is a third patterned metal oxide layer, and the third patterned metal oxide layer may include n-dipole dopant (e.g., La, Y, Sr, Lu, etc.). The third composition may be the same or different than the second composition and/or the first composition. In some embodiments, the third dipole dopant is different than the first dipole dopant and/or the second dipole dopant. For example, the third dipole dopant and the first dipole dopant (and/or the second dipole dopant) are different n-dipole metals or different p-dipole metals. In another example, the third dipole dopant is a p-dipole metal, and the first dipole dopant (and/or the second dipole dopant) is an n-dipole metal, or vice versa. In some embodiments, the third dipole dopant is the same as the first dipole dopant and/or the second dipole dopant. In some embodiments, an atomic percentage of the third dipole dopant is different than an atomic percentage of the first dipole dopant and/or an atomic percentage of the second dipole dopant. In some embodiments, an atomic percentage of the third dipole dopant is the same as an atomic percentage of the first dipole dopant and/or an atomic percentage of the second dipole dopant. In some embodiments, a thickness of patterned dipole dopant source layer 340 is different than a thickness of patterned dipole dopant source layer 330 and/or a thickness of patterned dipole dopant source layer 320. In such embodiments, the third dipole dopant may be the same as the second dipole dopant and/or the first dipole dopant.

Thermal drive-in process 345 may be similar to thermal drive-in process 225, thermal drive-in process 235, thermal drive-in process 272, thermal drive-in process 325, thermal drive-in process 335, or a combination thereof described above. Because thermal drive-in process 345 diffuses third dipole dopant into covered portions of dipole-engineered gate dielectric 310" (i.e., portions having patterned dipole dopant source layer 340 thereon) but not into uncovered, exposed portions of dipole-engineered gate dielectric 310", compositions of covered portions of dipole-engineered gate dielectric 310" change, while compositions of exposed portions of dipole-engineered gate dielectric 310" do not (or negligibly) change. For example, gate dielectric 310 of transistor 305B becomes gate dielectrics 310B (which may include the high-k dielectric metal, oxygen, and third dipole metal), gate dielectric 310C of transistor 305D becomes gate dielectrics 310D (which may include the high-k dielectric metal, oxygen, second dipole metal, and third dipole metal), gate dielectric 310E of transistor 305F becomes gate dielectrics 310F (which may include the high-k dielectric metal, oxygen, first dipole metal, and third dipole metal), and gate dielectric 310G of transistor 305H becomes gate dielectrics 310H (which may include the high-k dielectric metal, oxygen, first dipole metal, second dipole metal, and third dipole metal). Further, compositions of gate dielectric 310 of transistor 305A, gate dielectric 310C of transistor 305C, gate dielectric 310E of transistor 305E, and gate dielectric 310G of transistor 310G do not (or negligibly) change. Gate dielectric 310 of transistor 305A, which is not doped with first dipole metal, second dipole metal, or third dipole metal, may be designated as gate dielectric 310A. Since the third dipole dopant may not diffuse uniformly and/or entirely through covered portions of dipole-engineered gate dielectric 310" and third dipole dopant is diffused into some portions, but not other portions, of dipole-engineered gate dielectric 310", gate dielectrics 310E may have diffusion region 328-1 therein; gate dielectric 310G may have diffusion region 328-2 therein; gate dielectrics 310C may have diffusion region 328-3 therein; gate dielectric 310B may have diffusion region 328-4 therein (e.g., along tops thereof) that may include the high-k dielectric metal, oxygen, and third dipole metal, while other portions of gate dielectrics 310B (e.g., bottoms thereof) include the high-k metal and oxygen, but not first dipole metal and/or second dipole metal; gate dielectric 310D may have diffusion region 328-5 therein (e.g., along tops thereof) that may include the high-k dielectric metal, oxygen, second dipole metal, and third dipole metal, while other portions of gate dielectrics 310D (e.g., bottoms thereof) include the high-k metal and oxygen, but not second dipole metal and/or third dipole metal; gate dielectric 310F may have diffusion region 328-6 therein (e.g., along tops thereof) that may include the high-k dielectric metal, oxygen, first dipole metal, and third dipole metal, while other portions of gate dielectrics 310F (e.g., bottoms thereof) include the high-k metal and oxygen, but not first dipole metal and/or third dipole metal; and gate dielectric 310H may have diffusion region 328-7 therein (e.g., along tops thereof) that may include the high-k dielectric metal, oxygen, first dipole metal, second dipole metal, and third dipole metal, while other portions of gate dielectrics 310H (e.g., bottoms thereof) include the high-k metal and oxygen, but not first dipole metal, second dipole metal, and/or third dipole metal.

Transistors 305A-305H thus have one of eight threshold voltages after a third dipole engineering loop. For example, transistor 305A has a first threshold voltage (Vt1) provided by gate dielectric 310A (i.e., undoped gate dielectric), transistor 305B has a second threshold voltage (Vt2) provided by gate dielectric 310B (i.e., gate dielectric doped with third dipole metal), transistor 305C has a third threshold voltage (Vt3) provided by gate dielectric 310C (i.e., gate dielectric doped with second dipole metal), transistor 305D has a fourth threshold voltage (Vt3) provided by gate dielectric 310D (i.e., gate dielectric doped with second dipole metal and third dipole metal), transistor 305E has a fifth threshold voltage (Vt5) provided by gate dielectric 310E (i.e., gate dielectric doped with first dipole metal), transistor 305F has a sixth threshold voltage (Vt6) provided by gate dielectric 310F (i.e., gate dielectric doped with first dipole metal and third dipole metal), transistor 305G has a seventh threshold voltage (Vt7) provided by gate dielectric 310G (i.e., gate dielectric doped with first dipole metal and second dipole metal), and transistor 305H has an eighth threshold voltage (Vt8) provided by gate dielectric 310H (i.e., gate dielectric doped with first dipole metal, second dipole metal, and third dipole metal).

In some embodiments, the first dipole metal, the second dipole metal, and the third dipole metal are the same dipole metal, and transistors 305A-305H have different concentrations of the dipole metal, which may be obtained by the patterned dipole dopant source layers (320, 330, 340) having different thicknesses and/or the thermal drive-in processes (325, 335, 345) implementing different drive-in temperatures and/or other parameters. In some embodiments, the first dipole metal, the second dipole metal, and the third dipole metal are different dipole metals. In such embodiments, the patterned dipole dopant source layers (320, 330, 340) may have the same or different thicknesses and/or the same or different process parameters may be implemented by the thermal drive-in processes. In some embodiments, the patterned dipole dopant source layers (320, 330, 340) are formed over gate dielectric 310, and a single thermal drive-in process is performed to drive dipole dopant from the patterned dipole dopant source layers into gate dielectric 310. In some embodiments, two thermal drive-in processes are implemented, instead of three. For example, a first thermal drive-in process is performed after forming patterned dipole dopant source layer 320 and patterned dipole dopant source layer 330 over gate dielectric 310 and a second thermal drive-in process is performed after removing patterned dipole dopant source layer 320 and patterned dipole dopant source layer 330 and forming patterned dipole dopant source layer 340 over gate dielectric 310. In another example, a first thermal drive-in process is performed after forming patterned dipole dopant source layer 320 over gate dielectric 310 and a second thermal drive-in process is performed after removing patterned dipole dopant source layer 320 and forming patterned dipole dopant source layer 330 and patterned dipole dopant source layer 340 over gate dielectric 310.

Figure 8:
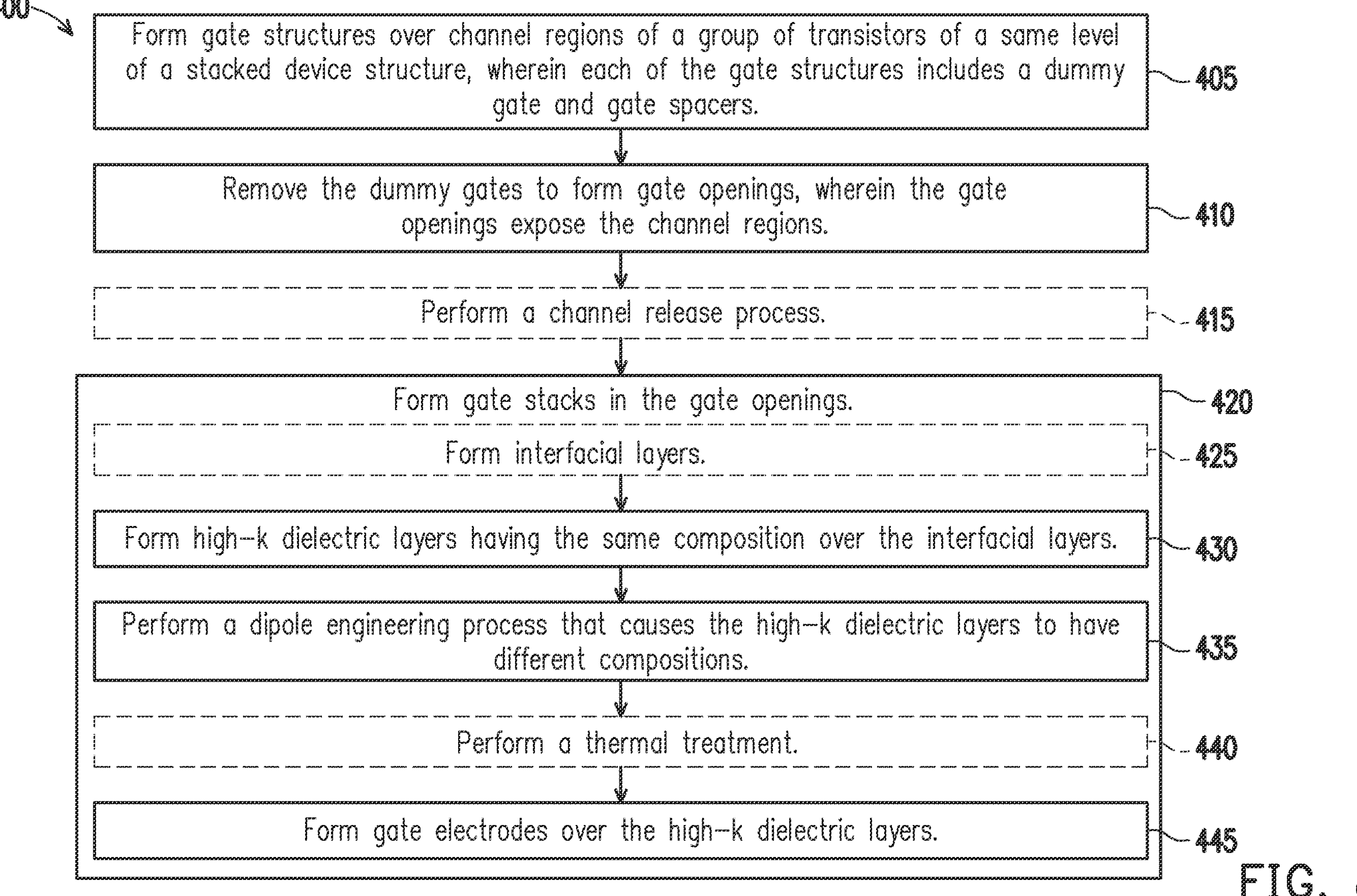
FIG. 8 is a flow chart of a method for fabricating gate stacks of transistors of a same level of a stacked device structure, such as gate stacks of lower transistors or upper transistors of the stacked device structure of FIG. 1A, according to various aspects of the present disclosure.

FIG. 8 is a flow chart of a method 400 for fabricating gate stacks of transistors of a same level of a stacked device structure, such as gate stacks of lower transistors 20L (e.g., gate stack 90L-1, gate stack 90L-2, gate stack 90L-3, and gate stack 90L-4) or gate stacks of upper transistors 20U (e.g., gate stack 90U-1, gate stack 90U-2, gate stack 90U-3, and gate stack 90U-4) of stacked device structure 10 of FIG. 1A, according to various aspects of the present disclosure. To provide transistors of a same level of a stacked transistor structure with different threshold voltages, method 400 implements the dipole engineering techniques described herein, such as method 100, method 150, method 250, or a combination thereof, to provide the gate stacks of the transistors with gate dielectrics having different compositions (e.g., gate dielectric 78L-1, gate dielectric 78L-2, gate dielectric 78L-3, and gate dielectric 78L-4 of lower transistors, such as described herein). For example, the gate dielectrics have different dipole dopant concentrations and/or different dipole dopants. FIG. 8 has been simplified for the sake of clarity to better understand the inventive concepts of the present disclosure. Additional steps may be provided before, during, and after method 400, and some of the steps described may be moved, replaced, or eliminated for additional embodiments of method 400.

Method 400 at block 405 includes forming gate structures over channel regions of a group of transistors of a same level of a stacked device structure. Each gate structure includes a dummy gate (e.g., a polysilicon gate) and gate spacers (e.g., gate spacers 44). The gate spacers may be disposed along sidewalls of the dummy gate. In some embodiments, where the transistors are GAA transistors, the channel regions may each include a semiconductor layer stack. In some embodiments, where the transistors are FinFET transistors, the channel regions may each include a semiconductor fin extending from a substrate. At block 410, method 400 includes removing dummy gates to form gate openings that expose the channel regions. In some embodiments, such as where the transistors are GAA transistors, method 400 at block 415 may include performing a channel release process. For example, the semiconductor layer stacks may each include first semiconductor layers and second semiconductor layers stacked vertically (e.g., along the z-direction) in an interleaving and/or alternating configuration from a top surface of a substrate, and the first semiconductor layers and the second semiconductor layers may have different compositions. The channel release process may include selectively removing the second semiconductor layers, such that the first semiconductor layers (e.g., semiconductor layers 26L or semiconductor layers 26L) are suspended over the substrate (e.g., substrate 14).

Method at block 420 includes forming gate stacks (e.g., high-k/metal gates, such as lower gate stacks of lower transistors 20L or upper gate stacks of upper transistors 20U) in the gate openings. The gate stacks may be formed by forming interfacial layers (e.g., interfacial layers 214) at block 425, forming high-k dielectric layers having the same composition (e.g., high-k dielectric layers 215 or high-k dielectric layers of gate dielectric 310) over the interfacial layers at block 430, and performing a dipole engineering process at block 435 (e.g., FIGS. 4B-4G, FIGS. 6B-6E, or FIGS. 8A-8G) that causes the high-k dielectric layers to have different compositions (e.g., high-k dielectric layers 215A-215D or high-k dielectric layers of gate dielectrics 310A-310H). The dipole engineering process implements N patterned dipole dopant source layers, such as described herein, to provide the high-k dielectric layers with different dipole dopant concentrations and/or different dipole dopants, such that each of the group of transistors exhibits one of $2^N$ threshold voltages. Method 400 at block 440 may further include performing a thermal treatment. In some embodiments, the thermal treatment is an annealing process performed after the thermal drive-in process. The gate stacks may further be formed by forming gate electrodes (e.g., gate electrodes 240, which may provide gate electrode 80L-1, gate electrode 80L-2, gate electrode 80L-3, and gate electrode 80L-4) over the high-k dielectric layers at block 445. The gate electrodes may be formed at the same time and have a same configuration (e.g., same layers) and/or a same composition. For example, the gate electrodes include a same work function layer(s), such as an N-WFM layer or a P-WFM layer.

Figure 9:
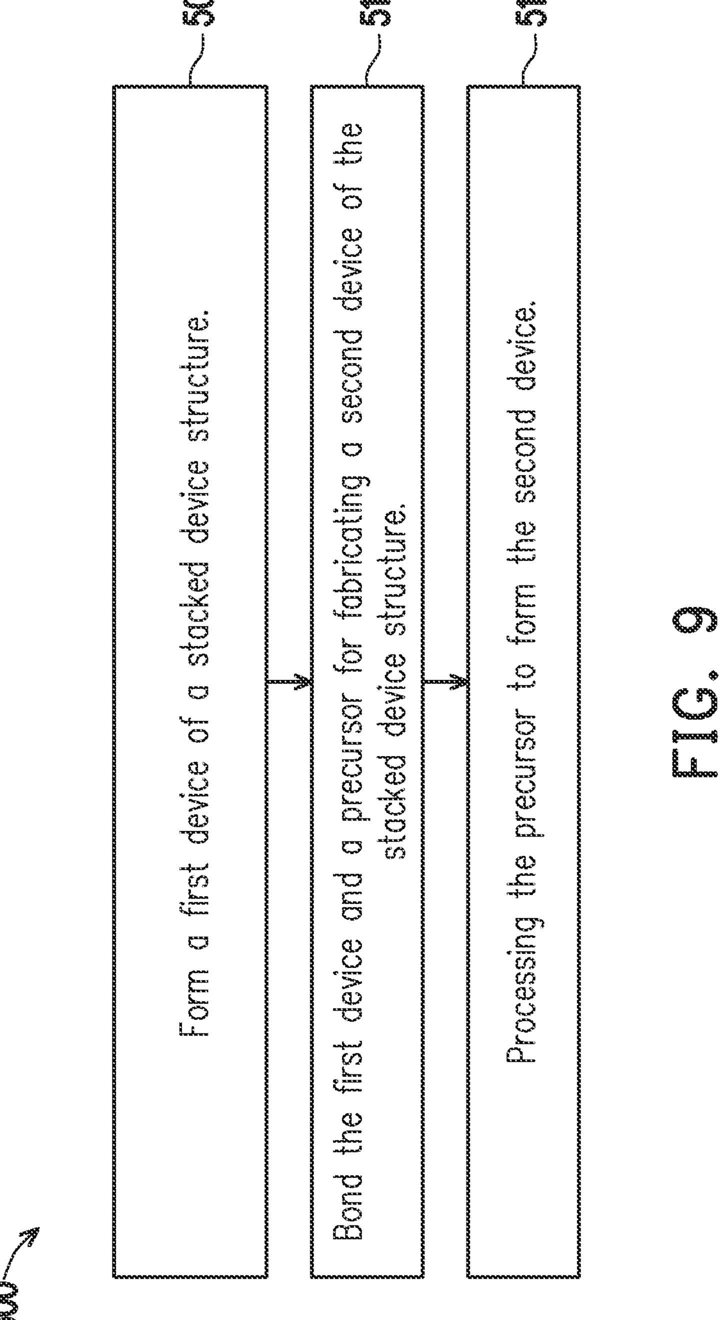
FIG. 9 is a flow chart of a method for fabricating a stacked device structure, such as the stacked device structure of FIG. 1A, according to various aspects of the present disclosure.

FIG. 9 is a flow chart of a method 500 for fabricating a stacked device structure, such as stacked device structure 10 of FIG. 1A, according to various aspects of the present disclosure. Method 500 fabricated stacked device structure 10 according to a sequential fabrication scheme, such as a sequential CFET process. Method 500 includes forming a first device (e.g., device 12L) of a stacked device structure (e.g., stacked device structure 10) at block 505, bonding the first device and a device precursor for fabricating a second device (e.g., device 12U) of the stacked device structure at block 510, and processing the device precursor to form the second device at block 515. Method 500 may implement the dipole engineering techniques and/or gate stack techniques described herein when forming gate stacks of the first device and/or gate stacks of the second device of the stacked device structure. FIG. 9 has been simplified for the sake of clarity to better understand the inventive concepts of the present disclosure. Additional steps can be provided before, during, and after method 500, and some of the steps described can be moved, replaced, or eliminated for additional embodiments of method 500.

At block 505, forming the first device may include depositing a semiconductor layer stack (including first semiconductor layers and second semiconductor layers) over a substrate (e.g., substrate 14) and patterning the semiconductor layer stack (e.g., by a fin fabrication process) and, optionally, the substrate to form a semiconductor fin extending from the substrate. The semiconductor fin may include a patterned portion of semiconductor layer stack (i.e., first semiconductor layers and second semiconductor layers) and a patterned portion of the substrate (e.g., mesa 14'). The semiconductor fin may extend along an x-direction, having a length in the x-direction, a width in the y-direction, and a height in the z-direction. The first semiconductor layers and second semiconductor layers stacked may be vertically (e.g., along a z-direction) in an interleaving and/or alternating configuration from a top surface of the substrate. The first semiconductor layers and the second semiconductor layers have different compositions to achieve etching selectivity and/or different oxidation rates. For example, the first semiconductor layers and the semiconductor layers include different materials, constituent atomic percentages, constituent weight percentages, thicknesses, other characteristics, or a combination thereof to achieve desired etching selectivity. In some embodiments, the first semiconductor layers include silicon, and the second semiconductor layers include silicon germanium.

In some embodiments, method 500 at block 505 includes forming substrate isolation structures, which may be formed in trenches between the semiconductor fin and other semiconductor fins. The substrate isolation structures may fill lower portions of the trenches and surround portions of the semiconductor fin. Portions of the semiconductor fin that extend from top surfaces of the substrate isolation structures may be referred to as fin active regions. The substrate isolation structures may be formed by depositing a liner layer (e.g., a dielectric layer) that partially fills the trenches, depositing an oxide material over the liner layer that fills remainders of the trenches, performing a planarization process, and recessing and/or etching back the substrate isolation structures, such that the semiconductor fin protrudes therefrom. The planarization process may be performed until reaching and exposing a planarization stop layer. In some embodiments, the planarization process removes mask layers, any of the liner layer, any of the oxide material, any of the liner layer, or a combination thereof that are above and/or over top surfaces of the semiconductor fin. Remainders of the liner layer and the oxide material may form liners and bulk dielectrics, respectively, of the substrate isolation structures.

Method 500 at block 505 may include forming gate structures over the semiconductor fin and forming source/drain recesses in the semiconductor fin. The gate structures are formed over channel regions of the semiconductor fin, and the source/drain recesses are formed in source/drain regions of the semiconductor fin. The gate structures include dummy gates (e.g., polysilicon gates) and gate spacers (e.g., gate spacers 44). The gate spacers may be disposed along sidewalls of the dummy gates. The dummy gates extend lengthwise in a direction that is different than (e.g., orthogonal to) the lengthwise direction of the semiconductor fin. For example, the dummy gates extend along the y-direction, having a length in the y-direction, a width in the x-direction, and a height in the z-direction. In the X-Z plane, the gate structures may be disposed over tops of the channel regions of the semiconductor fin, and gate structures may be disposed between respective source/drain recesses. In the Y-Z plane, the dummy gates may be disposed on tops and sidewalls of the semiconductor fin, such that dummy gates wrap the channel regions. The dummy gates may include a dummy gate dielectric, a dummy gate electrode, and a hard mask. The dummy gate dielectric includes a dielectric material, such as silicon oxide, a high-k dielectric material, other suitable dielectric material, or a combination thereof. The dummy gate electrode includes a suitable dummy gate material, such as polysilicon. The hard mask includes suitable hard mask material, such as silicon nitride.

The source/drain recesses may be formed by performing an etching process that removes the first semiconductor layers and the second semiconductor layers in source/drain regions of the semiconductor fin. The source/drain recesses may expose a mesa (e.g., mesa 14'). The etching process may remove some, but not all, of the mesa, such that the source/drain recesses may extend below tops of the substrate isolation structures. Each source/drain recess has respective sidewalls formed by respective remaining portions of the first semiconductor layers and the second semiconductor layers in the channel regions of the semiconductor fin and a bottom formed by the mesa. The etching process is a dry etch, a wet etch, other suitable etch, or a combination thereof. The etching process may be a multistep etch process.

Method 500 at block 505 may include forming inner spacers (e.g., inner spacers 54). The inner spacers may be formed under the gate spacers along sidewalls of the second semiconductor layers. The inner spacers replace portions of the second semiconductor layers under the gate spacers, separate the first semiconductor layers from one another, and separate bottom first semiconductor layers from the mesa. Forming the inner spacers may include a first etching process, a deposition process, and a second etching process. The first etching process selectively etches the second semiconductor layers with no (or negligible) etching of the first semiconductor layers and the mesa. The first etching process may be configured to laterally etch the second semiconductor layers to reduce lengths thereof along the x-direction, thereby forming gaps between the first semiconductor layers and between the mesa and the first semiconductor layers. In some embodiments, the gaps laterally extend under the dummy gates. The deposition process forms a spacer layer that at least partially fills (and may completely fill) the gaps, and the second etching process selectively etches the spacer layer with no (or negligible) etching of the first semiconductor layer and the mesa, such that remainders of the spacer layer form the inner spacers. The spacer layer (and thus the inner spacers) includes a dielectric material. In some embodiments, the inner spacers have a multilayer structure and/or air gaps.

Method 500 at block 505 may include forming epitaxial source/drains (e.g., epitaxial source/drains 62L) in the source/drain recesses and forming a dielectric layer (e.g., CESL 70L and ILD layer 72L) over the epitaxial source/drains and the gate structures. The dielectric layer may be disposed between adjacent gate structures. Epitaxial source/drains may be formed by filling the source/drain recesses with one or more epitaxial semiconductor materials. The first semiconductor layers extend between the epitaxial source/drains. The epitaxial source/drains are formed by any suitable epitaxial deposition and/or growth process. In some embodiments, forming the dielectric layer 450 includes depositing a CESL over the epitaxial source/drains and the gate structures, depositing an ILD layer over the CESL, and performing a planarization process (e.g., CMP) to remove the CESL and/or the ILD layer from over the gate structures.

Method 500 at block 505 may include performing a gate replacement process, such as a process that replaces the dummy gates with respective metal gates (e.g., high-k/metal gates). The gate replacement process may include removing the dummy gates to form gate openings that expose the channel regions of the semiconductor fin and forming gate stacks (e.g., gate stack 90L-1, gate stack 90L-2, gate stack 90L-3, and gate stack 90L-4) in the gate openings. The gate stacks may be formed by depositing gate dielectrics that partially fill the gate openings, depositing gate electrodes that fill remainders of the gate openings, and performing a planarization process to remove portions of the gate dielectrics and/or portions of the gate electrodes over the dielectric layer. In some embodiments, method 500 implements method 100, method 150, method 250, or a combination thereof to form the gate stacks, which provides gate dielectrics of the gate stacks with different compositions. For example, the gate dielectrics (e.g., high-k dielectric layers thereof) of the gate stacks have different dipole dopant concentrations and/or different dipole dopants, which provides the first device of the stacked device structure with transistors (e.g., lower transistors 20L) having different threshold voltages. In some embodiments, method 500 at block 505 further includes recessing and/or etching back the gate stacks, such that top surfaces thereof are lower than a top surface of the dielectric layer (e.g., ILD layer 72L and/or CESL 70L), and forming hard masks (e.g., hard masks 92) over the gate stacks. The hard masks may be formed by depositing a hard mask material that fills recesses formed over the recessed gate stacks (e.g., having sidewalls formed by respective gate spacers and bottoms formed by a respective gate stack) and planarizing the hard mask material.

Method 500 at block 505 may include performing a channel release process before forming the gate dielectrics. The channel release process may include selectively removing the second semiconductor layers of channel regions of the semiconductor exposed by the gate openings. Removing the second semiconductor layers may form gaps/openings between the first semiconductor layers and between the first semiconductor layers and the mesa, such that the first semiconductor layers (e.g., semiconductor layers 26L) are suspended over the mesa. The gate dielectrics and/or the gate electrodes may fill the gaps, such that the gate dielectrics and/or the gate electrodes may form around the suspended first semiconductor layers.

In some embodiments, method 500 at block 505 may include forming interconnects, such as gate contacts and/or source/drain contacts. In some embodiments, forming source/drain contacts includes forming source/drain contact openings in the dielectric layer that expose the epitaxial source/drains and forming at least one electrically conductive layer (e.g., metal) in the source/drain contact openings. In some embodiments, the source/drain contact openings are formed by forming a patterned mask layer (e.g., an etch mask) over the dielectric layer and etching exposed portions of the dielectric layer. In some embodiments, forming at least one electrically conductive layer in the source/drain contact openings includes forming metal silicide layers over the epitaxial source/drains, depositing a barrier/liner layer that partially fills the source/drain contact openings, depositing a metal layer over the barrier/liner layer that fills remainders of the source/drain contact openings, and performing a planarization process to remove portions of the barrier/liner layer and/or the metal layer that are disposed over the tops of dielectric layer and/or the gate structures. In some embodiments, one or more insulation layers may be formed in the source/drain contact openings and processed to form contact spacers, such as dielectric layers and/or air gaps, along sidewalls of electrically conductive portions of the source/drain contacts (e.g., barrier layer and/or bulk metal layer).

At block 510, the device precursor for fabricating the second device may include a semiconductor layer stack disposed over a sacrificial/dummy substrate. The semiconductor layer stack may include be similar to the semiconductor layer stack processed to form the first device. For example, the semiconductor layer stack includes the first semiconductor layers and the second semiconductor layers. A bottom one of the second semiconductor layers may form a frontside of the second device, and a top one of the second semiconductor layers may form a backside of the second device. In some embodiments, the sacrificial substrate is a semiconductor substrate, such as a silicon substrate. In some embodiments, the sacrificial substrate is a carrier substrate that includes silicon, soda-lime glass, fused silica, fused quartz, calcium fluoride, other suitable carrier substrate material, or a combination thereof.

Method 500 at block 510 may include bonding and/or attaching a frontside of the first device (e.g., a frontside of device 12L) to a backside of device 12B by isolation structure 16 (also referred to as a bonding layer). In some embodiments, the first device is bonded to the device precursor using dielectric-to-dielectric bonding. For example, bonding includes forming a first insulation layer (i.e., a first dielectric layer) over frontside of the first device, forming a second insulation layer (i.e., a second dielectric layer) over a backside of the second device, flipping over and placing the device precursor over the first device, such that the second insulation layer contacts the first insulation layer, and performing an annealing process or other suitable process to effectuate bonding of the first insulation layer and the second insulation layer. In some embodiments, isolation structure 16 is an oxide layer that attaches the first device to the device precursor for fabricating the second device. In some embodiments, the dielectric-to-dielectric bonding process is an oxide-to-oxide bonding process that includes bonding an oxide layer formed on the first device with an oxide layer formed on the device precursor. After bonding, a thinning process and/or a de-bonding process may be performed to remove the sacrificial substrate from the frontside of the second device. For example, a planarization process, such as CMP, or an etching process may be performed to remove the sacrificial substrate. The top one of the second semiconductor layers may function as a CMP stop layer and/or an etch stop layer when removing the sacrificial substrate. Thereafter, the top one of the second semiconductor layers may be removed from the semiconductor layer stack, for example, by an etching process, which provides the device precursor with a top one of the first semiconductor layers.

Method 500 at block 510 may include processing the device precursor to form the second device in the same manner as described above with reference to forming the first device. For example, processing may include patterning the semiconductor layer stack of the device precursor to form a semiconductor fin extending from isolation structure 16, where the semiconductor fin includes a patterned portion of the semiconductor layer stack. Processing the device precursor may include forming gate structures (e.g., dummy gates and gate spacers (e.g., gate spacers 44)) over channel regions of the semiconductor fin, forming source/drain recesses in source/drain regions of the semiconductor fin, and forming inner spacers (e.g., inner spacers 54), such as described herein. Processing the device precursor may include forming epitaxial source/drains (e.g., epitaxial source/drains 62U) in the source/drain recesses and forming a dielectric layer (e.g., CESL 70U and ILD layer 72U) over the epitaxial source/drains and the gate structure, such as described herein. Processing the device precursor may include performing a gate replacement process, performing a channel release process (e.g., forming semiconductor layers 26U over isolation structure 16), and forming interconnects, such as gate contacts and/or source/drain contacts, of the second device, such as described herein.

The gate replacement process may include removing the dummy gates to form gate openings that expose the channel regions of the semiconductor fin and forming gate stacks (e.g., gate stack 90U-1, gate stack 90U-2, gate stack 90U-3, and gate stack 90U-4) in the gate openings. The gate stacks may be formed by depositing gate dielectrics that partially fill the gate openings, depositing gate electrodes that fill remainders of the gate openings, and performing a planarization process to remove portions of the gate dielectrics and/or portions of the gate electrodes over the dielectric layer. In some embodiments, block 515 implements method 100, method 150, method 250, or a combination thereof to form the gate stacks, which provides gate dielectrics of the gate stacks with different compositions. For example, the gate dielectrics (e.g., high-k dielectric layers thereof) of the gate stacks have different dipole dopant concentrations and/or different dipole dopants, which provides the second device of the stacked device structure with transistors (e.g., upper transistors 20U) having different threshold voltages. In some embodiments, method 500 at block 510 further includes recessing and/or etching back the gate stacks, such that top surfaces thereof are lower than a top surface of the dielectric layer (e.g., ILD layer 72U and/or CESL 70U), and forming hard masks (e.g., hard masks 92).

Since the second device is fabricated on the first device, processes implemented to form the upper transistors, such as the gate stack thereof, can negatively impact characteristics and/or reliability of the first device. For example, high temperature processes can undesirably alter doping profiles of the lower transistors, which can undesirably alter their threshold voltages, and/or degrade structural integrity of the lower transistors, which can undesirably degrade their reliability. To minimize and/or eliminate such negative impacts, temperatures of processes used to form the gate stacks of the second device may be lower than temperatures of processes used to form the gate stacks of the first device. For example, thermal drive-in temperatures implemented during the dipole engineering process used to form the gate stacks of the second device are lower than thermal drive-in temperatures implemented during the dipole engineering process used to form the gate stacks of the first device.

Devices and/or structures described herein, such as stacked device structure 10, device 12L, device 12U, lower transistors 20L, and upper transistors 20U may be included in a microprocessor, a memory, other IC device, or a combination thereof. In some embodiments, stacked device structures described herein are a portion of an IC chip, a system on chip (SoC), or portion thereof, that includes various passive and active microelectronic devices, such as resistors, capacitors, inductors, diodes, p-type FETs (PFETs), n-type FETs (NFETs), metal-oxide semiconductor FETs (MOSFETs), complementary metal-oxide semiconductor (CMOS) transistors, bipolar junction transistors (BJTs), laterally diffused MOS transistors, high voltage transistors, high frequency transistors, other components, or a combination thereof.

The present disclosure provides for many different embodiments. Gate stack (e.g., high-k/metal gate) fabrication methods that implement dipole engineering are described herein and provide numerous advantages, particularly for stacked device structures. The gate stacks disclosed herein may be implemented in a variety of device types. For example, the gate stacks described herein are suitable for planar field-effect transistors (FETs), multigate transistors, such as FinFETs, GAA transistors, omega-gate (Ω-gate) devices, pi-gate (Π-gate) devices, or a combination thereof, as well as strained-semiconductor devices, silicon-on-insulator (SOI) devices, partially-depleted SOI devices, fully-depleted SOI devices, other devices, or a combination thereof. The present disclosure further contemplates that one of ordinary skill may recognize other semiconductor devices, such as capacitors, that may benefit from the material layer stacks and dipole engineering techniques described herein.

An exemplary method includes forming gate dielectrics over channel structures of a group of transistors that belong to a same level of a stacked device structure and performing a dipole engineering process on the gate dielectrics. The dipole engineering process includes forming N patterned dipole dopant source layers over the gate dielectrics to provide the group of transistors with 2N threshold voltages. N is a number of patterned dipole dopant source layers formed over the gate dielectrics, N is an integer, N is greater than one, and the N patterned dipole dopant source layers have different patterns. The method further includes, after performing the dipole engineering process, forming gate electrodes over the gate dielectrics. The gate electrodes may have a same configuration. In some embodiments, the stacked device structure includes a lower device level and an upper device level and the group of transistors belong to the upper device level of the stacked device structure. In some embodiments, the stacked device structure includes a lower device level and an upper device level and the group of transistors belong to the lower device level of the stacked device structure.

In embodiments where the group of transistors belong to the lower device level of the stacked device structure, the group of transistors may be a first group of transistors, the method may further include forming a second group of transistors over the first group of transistors, the second group of transistors belong to the upper device level of the stacked device structure, and the second group of transistors are arranged relative to the first group of transistors to provide transistor stacks. Each of the transistor stacks includes an upper transistor of the second group of transistors disposed over a lower transistor of the first group of transistors. In some embodiments, the gate dielectrics are first gate dielectrics, the channel structures are first channel structures, the gate electrodes are first gate electrodes, the dipole engineering process is a first dipole engineering process and forming the second group of transistors includes forming second gate dielectrics over second channel structures of the second group of transistors and performing a second dipole engineering process on the second gate dielectrics. The second dipole engineering process includes forming M patterned dipole dopant source layers over the second gate dielectrics to provide the second group of transistors with 2M threshold voltages. M is a number of patterned dipole dopant source layers formed over the second gate dielectrics, M is an integer, M is greater than one, and the M patterned dipole dopant source layers have different patterns. In such embodiments, the method may further include, after performing the second dipole engineering process, forming second gate electrodes over the second gate dielectrics. In some embodiments, the first dipole engineering process includes a first thermal drive-in process that implements a first drive-in temperature, the second dipole engineering process includes a second thermal drive-in that implements a second drive-in temperature, and the second drive-in temperature is less than the first drive-in temperature.

In some embodiments, performing the dipole engineering process on the gate dielectrics includes forming a first patterned dipole dopant source layer having a first pattern and covering the gate dielectrics of a first set of the group of transistors and performing a first thermal drive-in process. The first thermal drive-in process drives a first dipole dopant from the first patterned dipole dopant source layer into the gate dielectrics of the first set of the group of transistors. In some embodiments, performing the dipole engineering process on the gate dielectrics includes removing the first patterned dipole dopant source layer, forming a second patterned dipole dopant source layer having a second pattern and covering the gate dielectrics of a second set of the group of transistors, performing a second thermal drive-in process, and removing the second patterned dipole dopant source layer. The second pattern is different than the first pattern, the second set of the group of transistors is different than the first set of the group of transistors, and the second set of the group of transistors and the first set of the group of transistors have at least one transistor in common. The second thermal drive-in process drives a second dipole dopant from the second patterned dipole dopant source layer into the gate dielectrics of the second set of the group of transistors.

In some embodiments, the first patterned dipole dopant source layer has a first thickness, the second patterned dipole dopant source layer has a second thickness, and the second thickness is different than the first thickness. In some embodiments, the first patterned dipole dopant source layer has a first composition, the second patterned dipole dopant source layer has a second composition, and the second composition is different than the first composition. In some embodiments, the first thermal drive-in process implements a first thermal drive-in temperature, the second thermal drive-in process implements a second thermal drive-in temperature, and the second thermal drive-in temperature is different than the first thermal drive-in temperature.

In some embodiments, performing the dipole engineering process on the gate dielectrics includes forming a first patterned dipole dopant source layer having a first pattern and covering the gate dielectrics of a first set of the group of transistors and forming a second patterned dipole dopant source layer having a second pattern and covering the gate dielectrics of a second set of the group of transistors. The second pattern is different than the first pattern, the second set of the group of transistors is different than the first set of the group of transistors, and the second set of the group of transistors and the first set of the group of transistors have at least one transistor in common. In some embodiments, performing the dipole engineering process on the gate dielectrics includes performing a thermal drive-in process that drives a first dipole dopant from the first patterned dipole dopant source layer into the gate dielectrics of the first set of the group of transistors and a second dipole dopant from the second patterned dipole dopant source layer into the gate dielectrics of the second set of the group of transistors. In some embodiments, performing the dipole engineering process on the gate dielectrics includes, after performing the thermal drive-in process, removing the second patterned dipole dopant source layer and the first patterned dipole dopant source layer.

In some embodiments, the first patterned dipole dopant source layer has a first thickness, the second patterned dipole dopant source layer has a second thickness, and the second thickness is different than the first thickness. In some embodiments, the first patterned dipole dopant source layer has a first composition, the second patterned dipole dopant source layer has a second composition, and the second composition is different than the first composition.

Another exemplary method includes forming a first lower transistor, a second lower transistor, a third lower transistor, and a fourth lower transistor. The forming includes forming a gate dielectric layer in a first lower transistor region, a second lower transistor region, a third lower transistor region, and a fourth lower transistor region. The forming further includes forming a first patterned dipole dopant source layer and a second patterned dipole dopant source layer over the gate dielectric layer. The first patterned dipole dopant source layer has a first pattern, the second patterned dipole dopant source layer has a second pattern, and the second pattern is different than the first pattern. The forming further includes performing a thermal drive-in process that drives a first dipole dopant and a second dipole dopant into the gate dielectric layer from the first patterned dipole dopant source layer and the second patterned dipole dopant source layer, respectively. The forming further includes, after removing the first patterned dipole dopant source layer and the second patterned dipole dopant source layer, forming a gate electrode layer over the gate dielectric layer in the first lower transistor region, the second lower transistor region, the third lower transistor region, and the fourth lower transistor region. The method may further include forming a first upper transistor over the first lower transistor, a second upper transistor over the second lower transistor, a third upper transistor over the third lower transistor, and a fourth upper transistor over the fourth lower transistor.

In some embodiments, the thermal drive-in process includes a first thermal drive-in process for driving the first dipole dopant into the gate dielectric layer from the first patterned dipole dopant source layer and a second thermal drive-in process for driving the second dipole dopant into the gate dielectric layer from the second patterned dipole dopant source layer. The first patterned dipole dopant source layer may be removed after performing the first thermal drive-in process and before forming the second patterned dipole dopant source layer. The second patterned dipole dopant source layer may be removed after performing the second thermal drive-in process. In some embodiments, the second patterned dipole dopant source layer is formed on the first patterned dipole dopant source layer. In some embodiments, the first dipole dopant and the second dipole dopant are n-dipole dopants, and the gate electrode layer is a p-metal layer or an n-metal layer.

Yet another exemplary method includes forming a first gate opening that exposes a first channel structure of a first transistor, a second gate opening that exposes a second channel structure of a second transistor, a third gate opening that exposes a third channel structure of a third transistor, and a fourth gate opening that exposes a fourth channel structure of a fourth transistor. The first transistor, the second transistor, the third transistor, and the fourth transistor belong to a same level of a stacked transistor structure. The method further includes forming a high-k dielectric layer over the first channel structure, the second channel structure, the third channel structure, and the fourth channel structure. The high-k dielectric layer partially fills the first gate opening, the second gate opening, the third gate opening, and the fourth gate opening. The method further includes performing a dipole engineering process on the high-k dielectric layer to provide the first transistor with a first high-k dielectric, the second transistor with a second high-k dielectric, the third transistor with a third high-k dielectric, and the fourth transistor with a fourth high-k dielectric. The dipole engineering process includes forming a first patterned dipole dopant source layer and a second patterned dipole dopant source layer over the high-k dielectric layer. The first patterned dipole dopant source layer has a first pattern, the second patterned dipole dopant source layer has a second pattern, and the second pattern is different than the first pattern. The dipole engineering process further includes performing a thermal drive-in process that drives a first dipole dopant and a second dipole dopant into the high-k dielectric layer from the patterned first dipole dopant source layer and the patterned second dipole dopant source layer, respectively. The dipole engineering process further includes removing the first patterned dipole dopant source layer and the second patterned dipole dopant source layer. The method may further include forming a gate electrode layer over the first high-k dielectric, the second high-k dielectric, the third high-k dielectric, and the fourth high-k dielectric. The gate electrode layer fills a remainder of the first gate opening, the second gate opening, the third gate opening, and the fourth gate opening.

In some embodiments, the first high-k dielectric includes the first dipole dopant and the second dipole dopant, the second high-k dielectric includes the first dipole dopant, the third high-k dielectric includes the second dipole dopant, and the fourth high-k dielectric is not doped with the first dipole dopant or the second dipole dopant. In some embodiments, the first patterned dipole dopant source layer is a first metal oxide layer, and the second patterned dipole dopant source layer is a second metal oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming gate dielectrics over channel structures of a group of transistors that belong to a same level of a stacked device structure;

performing a dipole engineering process on the gate dielectrics, wherein the dipole engineering process includes forming N patterned dipole dopant source layers over the gate dielectrics to provide the group of transistors with $2^N$ threshold voltages, wherein N is a number of patterned dipole dopant source layers formed over the gate dielectrics, N is an integer, N is greater than one, and the N patterned dipole dopant source layers have different patterns, wherein the performing the dipole engineering process on the gate dielectrics includes:

forming a first patterned dipole dopant source layer having a first pattern and covering the gate dielectrics of a first set of the group of transistors, performing a first thermal drive-in process, wherein the first thermal drive-in process drives a first dipole dopant from the first patterned dipole dopant source layer into the gate dielectrics of the first set of the group of transistors, removing the first patterned dipole dopant source layer, forming a second patterned dipole dopant source layer having a second pattern and covering the gate dielectrics of a second set of the group of transistors, wherein the second pattern is different than the first pattern, the second set of the group of transistors is different than the first set of the group of transistors, and the second set of the group of transistors and the first set of the group of transistors have at least one transistor in common, performing a second thermal drive-in process, wherein the second thermal drive-in process drives a second dipole dopant from the second patterned dipole dopant source layer into the gate dielectrics of the second set of the group of transistors, and removing the second patterned dipole dopant source layer; and after performing the dipole engineering process, forming gate electrodes over the gate dielectrics.

2. The method of claim 1, wherein the first dipole dopant is different than the second dipole dopant.

3. The method of claim 1, wherein the first patterned dipole dopant source layer has a first thickness, the second patterned dipole dopant source layer has a second thickness, and the second thickness is different than the first thickness.

4. The method of claim 1, wherein the first patterned dipole dopant source layer has a first composition, the second patterned dipole dopant source layer has a second composition, and the second composition is different than the first composition.

5. The method of claim 1, wherein the first thermal drive-in process implements a first thermal drive-in temperature, the second thermal drive-in process implements a second thermal drive-in temperature, and the second thermal drive-in temperature is different than the first thermal drive-in temperature.

6. The method of claim 1, wherein the first dipole dopant is the same as the second dipole dopant.

7. The method of claim 1, wherein the first dipole dopant and the second dipole dopant are n-dipole dopants.

8. The method of claim 1, wherein the forming the gate electrodes over the gate dielectrics includes forming a work function layer over the gate dielectrics, wherein the group of transistors include the work function layer.

9. The method of claim 1, wherein the stacked device structure includes a lower device level and an upper device level and the group of transistors belong to the upper device level of the stacked device structure.

10. The method of claim 1, wherein the stacked device structure includes a lower device level and an upper device level and the group of transistors belong to the lower device level of the stacked device structure.

11. The method of claim 10, wherein the group of transistors is a first group of transistors and the method further comprises:

forming a second group of transistors over the first group of transistors, wherein the second group of transistors belong to the upper device level of the stacked device structure and the second group of transistors are arranged relative to the first group of transistors to provide transistor stacks, wherein each of the transistor stacks includes an upper transistor of the second group of transistors disposed over a lower transistor of the first group of transistors.

12. The method of claim 11, wherein:

the gate dielectrics are first gate dielectrics, the channel structures are first channel structures, the gate electrodes are first gate electrodes, the dipole engineering process is a first dipole engineering process; and the forming the second group of transistors includes:

forming second gate dielectrics over second channel structures of the second group of transistors, performing a second dipole engineering process on the second gate dielectrics, wherein the second dipole engineering process includes forming M patterned dipole dopant source layers over the second gate dielectrics to provide the second group of transistors with $2^M$ threshold voltages, wherein M is a number of patterned dipole dopant source layers formed over the second gate dielectrics, M is an integer, M is greater than one, and the M patterned dipole dopant source layers have different patterns, and after performing the second dipole engineering process, forming second gate electrodes over the second gate dielectrics.

13. The method of claim 12, wherein the first thermal drive-in process implements a first drive-in temperature, the second thermal drive-in process implements a second drive-in temperature, the second dipole engineering process includes a third thermal drive-in that implements a third drive-in temperature, and the third drive-in temperature is less than the first drive-in temperature and the second drive-in temperature.

14. A method comprising:

forming a first lower transistor, a second lower transistor, a third lower transistor, and a fourth lower transistor, wherein the forming includes:

forming a gate dielectric layer in a group of transistor regions that includes a first lower transistor region, a second lower transistor region, a third lower transistor region, and a fourth lower transistor region, forming a first patterned dipole dopant source layer and a second patterned dipole dopant source layer over the gate dielectric layer, wherein the first patterned dipole dopant source layer has a first pattern, the second patterned dipole dopant source lay er has a second pattern, and the second pattern is different than the first pattern, such that the first patterned dipole dopant source layer is over the gate dielectric layer in a first subgroup of the group of transistor regions, the second patterned dipole dopant source layer is over the gate dielectric layer in a second subgroup of the group of transistor regions, and the first subgroup of the group of transistor regions is different than the second subgroup of the group of transistor regions, performing a first thermal drive-in process that drives a first dipole into the gate dielectric layer from the first patterned dipole dopant source layer and a second thermal drive-in process that drives a second dipole dopant into the gate dielectric layer from the second patterned dipole dopant source layer, and after removing the first patterned dipole dopant source layer and the second patterned dipole dopant source layer, forming a gate electrode layer over the gate dielectric layer in the first lower transistor region, the second lower transistor region, the third lower transistor region, and the fourth lower transistor region; and forming a first upper transistor over the first lower transistor, a second upper transistor over the second lower transistor, a third upper transistor over the third lower transistor, and a fourth upper transistor over the fourth lower transistor.

15. The method of claim 14, wherein the first thermal drive-in process and the second thermal drive-in process implement different process parameters.

16. The method of claim 14, wherein the first dipole dopant and the second dipole dopant are n-dipole dopants, and the gate electrode layer is an n-metal layer.

17. The method of claim 14, wherein the first dipole dopant and the second dipole dopant are n-dipole dopants, and the gate electrode layer is a p-metal layer.

18. A method comprising:

forming a first gate opening that exposes a first channel structure of a first transistor, a second gate opening that exposes a second channel structure of a second transistor, a third gate opening that exposes a third channel structure of a third transistor, and a fourth gate opening that exposes a fourth channel structure of a fourth transistor, wherein the first transistor, the second transistor, the third transistor, and the fourth transistor belong to a same level of a stacked transistor structure;

forming a high-k dielectric layer over the first channel structure, the second channel structure, the third channel structure, and the fourth channel structure, wherein the high-k dielectric layer partially fills the first gate opening, the second gate opening, the third gate opening, and the fourth gate opening;

performing a dipole engineering process on the high-k dielectric layer to provide the first transistor with a first high-k dielectric, the second transistor with a second high-k dielectric, the third transistor with a third high-k dielectric, and the fourth transistor with a fourth high-k dielectric, wherein the dipole engineering process includes:

forming a first patterned dipole dopant source layer and a second patterned dipole dopant source layer over the high-k dielectric layer, wherein the first patterned dipole dopant source layer has a first pattern, the second patterned dipole dopant source layer has a second pattern, and the second pattern is different than the first pattern, such that the first patterned dipole dopant source layer is over the high-k dielectric layer of a first subgroup of a group of transistors, the second patterned dipole dopant source layer is over the high-k dielectric layer of a second subgroup of the group of transistors, the first subgroup of the group of transistors is different than the second subgroup of the group of transistors, and the group of transistors includes the first transistor, the second transistor, the third transistor, and the fourth transistor, performing a first thermal drive-in process that drives a first dipole into the high-k dielectric layer from the patterned first dipole dopant source layer and a second thermal drive-in process that drives a second dipole dopant into the high-k dielectric layer from the patterned second dipole dopant source layer, and removing the first patterned dipole dopant source layer and the second patterned dipole dopant source layer; and forming a gate electrode layer over the first high-k dielectric, the second high-k dielectric, the third high-k dielectric, and the fourth high-k dielectric, wherein the gate electrode layer fills a remainder of the first gate opening, the second gate opening, the third gate opening, and the fourth gate opening.

19. The method of claim 18, wherein the first high-k dielectric includes the first dipole dopant and the second dipole dopant, the second high-k dielectric includes the first dipole dopant, the third high-k dielectric includes the second dipole dopant, and the fourth high-k dielectric is not doped with the first dipole dopant or the second dipole dopant.

20. The method of claim 18, wherein:

the first patterned dipole dopant source layer is a first metal oxide layer; and the second patterned dipole dopant source layer is a second metal oxide layer.

* * * * *